United States Patent
Chen et al.

(10) Patent No.: US 8,557,610 B2
(45) Date of Patent: Oct. 15, 2013

(54) METHODS OF INTEGRATED SHIELDING INTO MTJ DEVICE FOR MRAM

(75) Inventors: Wei-Chuan Chen, Taipei (TW); Xia Li, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 253 days.

(21) Appl. No.: 13/026,320

(22) Filed: Feb. 14, 2011

(65) Prior Publication Data

US 2012/0205764 A1 Aug. 16, 2012

(51) Int. Cl.
*H01L 21/00* (2006.01)
*H01L 29/82* (2006.01)

(52) U.S. Cl.
USPC ............ 438/3; 438/652; 257/422; 257/659; 257/E29.323; 257/E21.665

(58) Field of Classification Search
None
See application file for complete search history.

(56) References Cited

U.S. PATENT DOCUMENTS

| | | | |
|---|---|---|---|
| 5,668,688 A * | 9/1997 | Dykes et al. | 360/324.1 |
| 6,201,673 B1 * | 3/2001 | Rottmayer et al. | 360/324.12 |
| 6,542,342 B1 * | 4/2003 | Hayashi et al. | 360/324.2 |
| 6,950,290 B2 | 9/2005 | Hayashi et al. | |
| 7,356,909 B1 | 4/2008 | Min et al. | |
| 7,372,673 B2 * | 5/2008 | Hayashi et al. | 360/324.2 |
| 7,476,954 B2 | 1/2009 | Wang et al. | |
| 7,598,597 B2 | 10/2009 | Guo et al. | |
| 8,194,362 B2 * | 6/2012 | Ibusuki et al. | 360/324.11 |
| 2005/0168883 A1 | 8/2005 | Nakashio et al. | |
| 2006/0229683 A1 | 10/2006 | Wang et al. | |
| 2010/0032779 A1 * | 2/2010 | Tsukamoto et al. | 257/421 |
| 2010/0072566 A1 * | 3/2010 | Kang et al. | 257/422 |
| 2010/0102404 A1 * | 4/2010 | Li et al. | 257/421 |
| 2010/0181633 A1 * | 7/2010 | Nam et al. | 257/421 |
| 2010/0219491 A1 * | 9/2010 | Lee et al. | 257/421 |
| 2010/0289098 A1 | 11/2010 | Li et al. | |
| 2011/0049654 A1 * | 3/2011 | Li et al. | 257/421 |
| 2011/0049656 A1 * | 3/2011 | Li et al. | 257/421 |
| 2011/0169112 A1 * | 7/2011 | Chen et al. | 257/421 |

OTHER PUBLICATIONS

International Search Report and Written Opinion—PCT/US2012/025133—ISA/EPO—Jul. 9, 2012.

* cited by examiner

*Primary Examiner* — Alonzo Chambliss
(74) *Attorney, Agent, or Firm* — Sam Talpalatsky; Nicholas J. Pauley; Joseph Agusta

(57) ABSTRACT

Methods and apparatus for shielding a shielding a non-volatile memory, such as shielding a magnetic tunnel junction (MTJ) device from a magnetic flux are provided. In an example, a shielding layer is formed adjacent to an electrode of an MTJ device, such that the shielding layer substantially surrounds a surface of the electrode, and a metal line is coupled to the shielding layer. The metal line can be coupled to the shielding layer by a via.

30 Claims, 36 Drawing Sheets

PARALLEL MAGNETIZATION
LOW RESISTANCE
STATE "0"

ANTIPARALLEL MAGNETIZATION
HIGH RESISTANCE
STATE "1"

From Fig. 11G

Metal line direct contact process

METHODS OF INTEGRATED SHIELDING INTO MTJ DEVICE FOR MRAM

FIELD OF DISCLOSURE

This disclosure relates generally to electronics, and more specifically, but not exclusively, to apparatus and methods for shielding a non-volatile memory.

BACKGROUND

Random access memory (RAM) is a ubiquitous component of modern digital architectures. RAM can be a standalone device, or can be integrated in a device that uses the RAM, such as a microprocessor, microcontroller, application specific integrated circuit (ASIC), system-on-chip (SoC), and other like devices. RAM can be volatile or non-volatile. Volatile RAM loses its stored information whenever power is removed. Non-volatile RAM can maintain its memory contents even when power is removed. Although non-volatile RAM has advantages, such as an ability to retain its contents without applied power, conventional non-volatile RAM has slower read/write times than volatile RAM.

Magnetoresistive Random Access Memory (MRAM) is a non-volatile memory technology having response (read/write) times comparable to volatile memory. In contrast to conventional RAM technologies, which store data as electric charges or current flows, MRAM uses magnetic elements. As illustrated in FIGS. 1A and 1B, a magnetic tunnel junction (MTJ) storage element 100 can be formed from two magnetic layers, a pin layer 110, also known as a fixed layer, and a free layer 130, each of which can have a magnetic field, separated by an insulating (tunnel barrier) layer 120. One of the two layers (e.g., pin layer 110), is pinned to a particular polarity. The other layer's (e.g., free layer 130) polarity 132 is free to change to match that of an external applied field. A change in the polarity 132 of the free layer 130 changes the resistance of the MTJ storage element 100. For example, when the polarities are aligned, as depicted in FIG. 1A, a low resistance state exists. When the polarities are not aligned, as depicted in FIG. 1B, then a high resistance state exists. The illustration of MTJ 100 is simplified, and each layer illustrated can comprise one or more layers of materials.

Referring to FIG. 2A, a memory cell 200 of a conventional MRAM is depicted during a read operation. The cell 200 includes a transistor 210, a bit line 220, a digit line 230 and a word line 240. The cell 200 is read by measuring the electrical resistance of the MTJ 100. For example, a particular MTJ 100 can be selected by activating an associated transistor 210, which can switch current from a bit line 220 through the MTJ 100. Due to a tunnel magnetoresistive effect, the electrical resistance of the MTJ 100 changes based on the orientation of the polarities in the two magnetic layers (e.g., 110, 130), as discussed above. A resistance inside any particular MTJ 100 can be determined from a current intensity determined by the polarity of the free layer. If the pin layer 110 and free layer 130 have the same polarity, the resistance is low and a logic "0" is read. If the pin layer 110 and free layer 130 have an opposing polarity, the resistance is higher and a logic "1" is read.

Referring to FIG. 2B, the memory cell 200 of a conventional MRAM is depicted during a write operation, which is a magnetic operation. Transistor 210 is off during the write operation. Current propagates through the bit line 220 and the digit line 230 to establish magnetic fields 250 and 260, which affect the polarity of the free layer of the MTJ 100, and consequently the logic state of the cell 200. Accordingly, data can be written to, and stored in, the MTJ 100.

MRAM has several desirable characteristics that make it a candidate for a universal memory, such as high speed, high density (i.e., small bitcell size), low power consumption, and no degradation over time.

A variation of MRAM is Spin Transfer Torque Magnetoresistive Random Access Memory (STT-MRAM). STT-MRAM uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During a write operation, the spin-polarized electrons exert torque on a free layer, which switches a polarity of the free layer. During a read operation, a current detects the resistance/logic state of the MTJ storage element, as discussed in the foregoing description. As illustrated in FIG. 3A, a STT-MRAM bit cell 300 includes a MTJ 305, a transistor 310, a bit line 320, and a word line 330. The transistor 310 is switched on for both read and write operations to allow current to flow through the MTJ 305, so the logic state can be read or written.

Referring to FIG. 3B, a more detailed diagram of a STT-MRAM cell 301 is illustrated, for further discussion of the read/write operations. In addition to the previously discussed elements such as the MTJ 305, the transistor 310, the bit line 320 and the word line 330, a source line 340, a sense amplifier 350, read/write circuitry 360, and a bit line reference 370 are illustrated. As discussed above, the write operation in an STT-MRAM is electrical. The read/write circuitry 360 generates a write voltage between the bit line 320 and the source line 340. Depending on the polarity of the voltage between the bit line 320 and the source line 340, the polarity of the free layer of the MTJ 305 can be changed, and correspondingly, the logic state can be written to the cell 301. Likewise, during a read operation, a read current is generated, which flows between the bit line 320 and the source line 340 through the MTJ 305. When the current is permitted to flow via the transistor 310, the resistance (logic state) of the MTJ 305 is determined, based on the voltage differential between the bit line 320 and the source line 340, which is compared to a reference 370, and then amplified by the sense amplifier 350. Additional details are provided, for example, in U.S. Pat. No. 7,764,537, which is incorporated herein by reference in its entirety.

Accordingly, a non-volatile MRAM memory can be fabricated as an array of the memory cells 200. A gate of the transistor 210 is coupled to a word line (WL). During write operations, a supply voltage is applied to the bit line 220 or the digit line 230. During read operations, a read voltage is applied to the bit line 220, and the digit line 230 is set to ground. The WL is coupled to a supply voltage during both read and write operations.

Despite the characteristics described above, the memory cell 200 is not a perfect device. FIG. 4 depicts a performance characteristic 400 of the conventional MTJ storage element 100 to be improved upon. Specifically, FIG. 4 depicts susceptibility of the conventional MTJ storage element 100 to a magnetic flux 405 emanating from outside the MTJ storage element 100. The magnetic flux 405 can originate from current-carrying conductors such as a metal line 410 coupled to the MTJ 305, from a metal line 415 external to the MTJ 305, and/or from outside of an integrated circuit package including the MTJ 305. The magnetic flux 415 affects the polarity 132 of the magnetic field in the free layer 130, causing the resistance state to become less-defined, and in some cases, reversed.

Accordingly, there are long-felt industry needs for apparatus and methods to shield an MTJ device from magnetic flux (i.e., electromagnetic interference) emanating from outside the MTJ device. Shielding the MTJ device will improve performance and reliability of the MRAM into which the MTJ device is integrated.

SUMMARY

Exemplary embodiments of the invention are directed to methods and apparatus for shielding a non-volatile memory, such as shielding a magnetic tunnel junction (MTJ) device from a magnetic flux.

In an example, a shielding layer is formed adjacent to an electrode of an MTJ device, such that the shielding layer substantially surrounds a surface of the electrode, and a metal line is coupled to the shielding layer. The metal line can be coupled to the shielding layer by a via.

In another example, provided is an MTJ device protected by an integrated shielding apparatus. The MTJ device is on a substrate, and has a bottom electrode, one or more pinned layers, a barrier layer, one or more free layers, and a top electrode. The MTJ device also has a shielding layer over the top electrode, such that the shielding layer substantially surrounds a top surface of the top electrode, as well as a metal line connection on the shielding layer. The shielding layer can be formed of a conductive material. The metal line connection can be through a via coupled to the shielding layer. The MTJ device can be integrated into a device, selected from the group consisting of a set top box, music player, video player, entertainment unit, navigation device, communications device, personal digital assistant (PDA), fixed location data unit, and a computer.

In a further example, provided is an MTJ device protected by an integrated shielding apparatus. The MTJ device includes means for reducing a magnetic field intensity in a vicinity of an MTJ electrode using a shielding layer adjacent to the MTJ electrode, such that the shielding layer substantially surrounds a surface of the MTJ electrode. The MTJ device also has a metal line connection on the shielding layer.

In an example, provided is a method for protecting an MTJ device by utilizing an integrated shielding apparatus. The method includes forming an MTJ device on a substrate. The MTJ device includes a bottom electrode, one or more pinned layers, a barrier layer, one or more free layers, and a first top electrode layer. The method further includes forming a shielding layer over the first top electrode layer, such that the shielding layer completely surrounds a top surface of the first top electrode layer, and forming a second top electrode layer over the shielding layer. Also, a metal line connection is formed on the second top electrode layer, such that the MTJ device is protected by the shielding layer from magnetic forces caused by the metal line.

In an additional example, provided is a non-transitory computer-readable medium, comprising instructions stored thereon that, if executed by a lithographic device, cause the lithographic device to perform at least a part of a method. The method includes forming an MTJ device on a substrate. The MTJ device includes a bottom electrode, one or more pinned layers, a barrier layer, one or more free layers, and a first top electrode layer. The method also includes forming a shielding layer over the first top electrode layer, such that the shielding layer completely surrounds a top surface of the first top electrode layer, and forming a second top electrode layer over the shielding layer. Further, the method includes forming a metal line connection on the second top electrode layer, such that the MTJ device is protected by the shielding layer from magnetic forces caused by the metal line.

Further provided is an MTJ device protected by an integrated shielding apparatus. The MTJ device is on a substrate, and includes a bottom electrode, one or more pinned layers, a barrier layer, one or more free layers, and a first top electrode layer. The MTJ device also includes a shielding layer over the first top electrode layer, such that the shielding layer completely surrounds a top surface of the first top electrode layer, and a second top electrode layer over the shielding layer. The MTJ device additionally includes a metal line connection on the second top electrode layer, such that the MTJ device is protected by the shielding layer from magnetic forces caused by the metal line. The shielding layer can be formed of a conductive material. The metal line connection can be through a via coupled to the shielding layer. The MTJ device can be integrated into a device, selected from the group consisting of a set top box, music player, video player, entertainment unit, navigation device, communications device, PDA, fixed location data unit, and a computer.

In an example, provided is an MTJ device protected by an integrated shielding apparatus. The MTJ device includes means for reducing a magnetic field intensity in a vicinity of a first MTJ electrode using a shielding layer over the first MTJ electrode, such that the shielding layer substantially surrounds a surface of the first MTJ electrode. The MTJ device also includes a second electrode layer adjacent to the shielding layer, and a metal line coupled to the second electrode layer, such that the MTJ device is protected by the shielding layer from magnetic forces caused by the metal line.

The foregoing has broadly outlined the features and technical advantages of the present teachings in order that the detailed description that follows may be better understood. Additional features and advantages are described herein, which form the subject of the claims. The conception and specific embodiments disclosed can be readily utilized as a basis for modifying or designing other structures for carrying out the same purposes of the present teachings. Such equivalent constructions do not depart from the technology of the teachings as set forth in the appended claims. The novel features which are believed to be characteristic of the teachings, both as to its organization and method of operation, together with further objects and advantages are better understood from the following description when considered in connection with the accompanying figures. Each of the figures is provided for the purpose of illustration and description only, and do not define limits of the present teachings.

BRIEF DESCRIPTION OF THE DRAWINGS

The accompanying drawings are presented to describe examples of the present teachings, and are not provided as limitations.

Figure 1A:
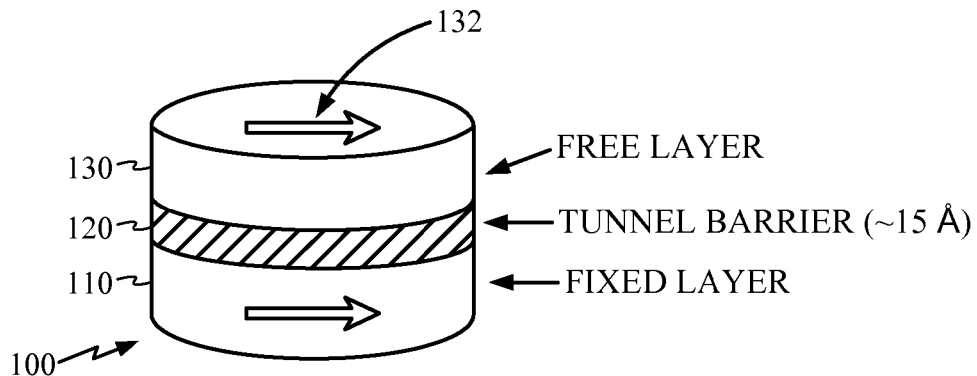
FIGS. 1A and 1B depict a magnetic tunnel junction (MTJ) storage element.
Figure 1B:
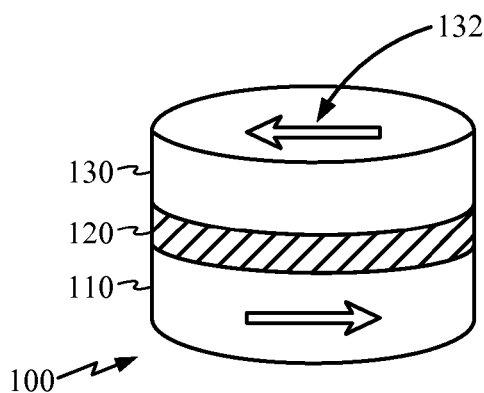
Figure 2A:
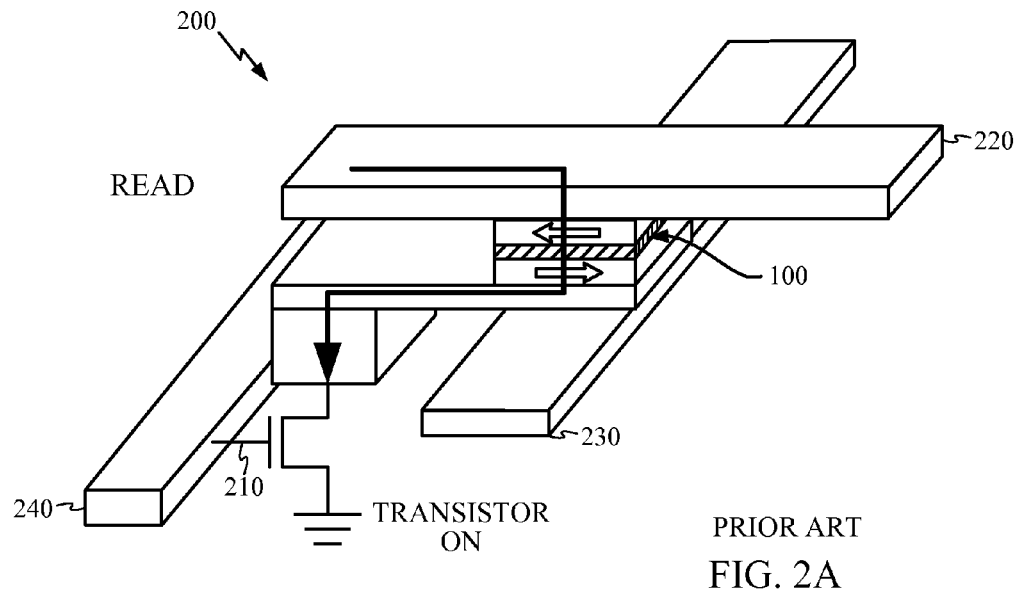
FIGS. 2A and 2B depict a Magnetoresistive Random Access Memory (MRAM) cell during read and write operations, respectively.
Figure 2B:
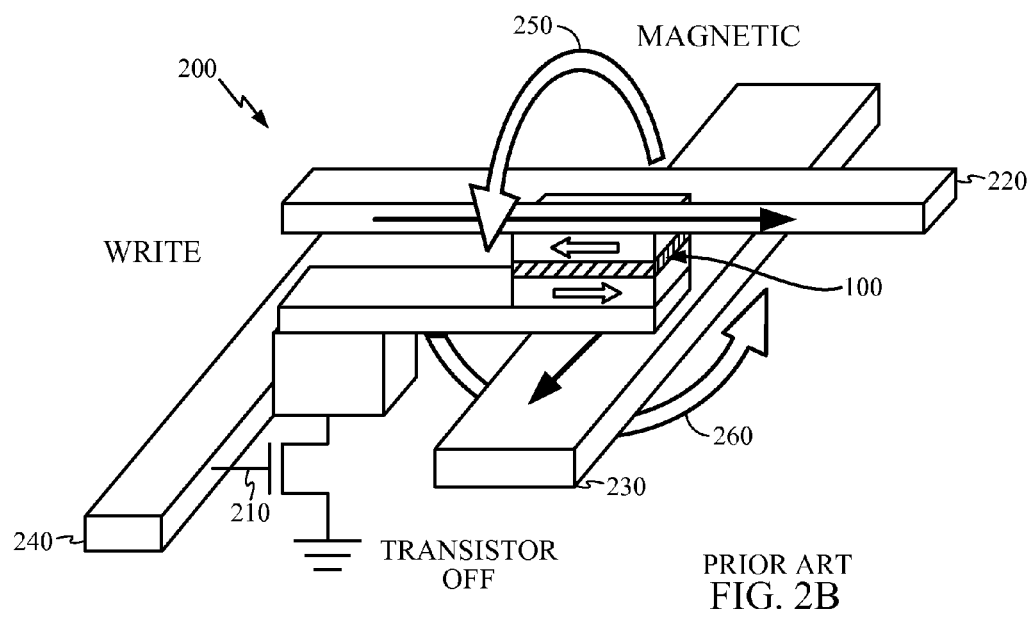
Figure 3A:
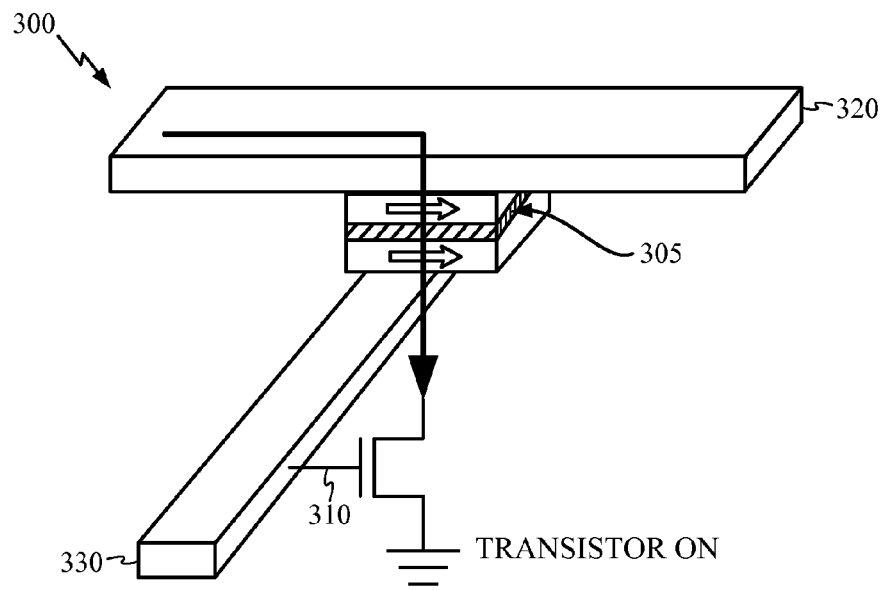
FIGS. 3A and 3B depict Spin Transfer Torque Magnetoresistive Random Access Memory (STT-MRAM) cells.
Figure 3B:
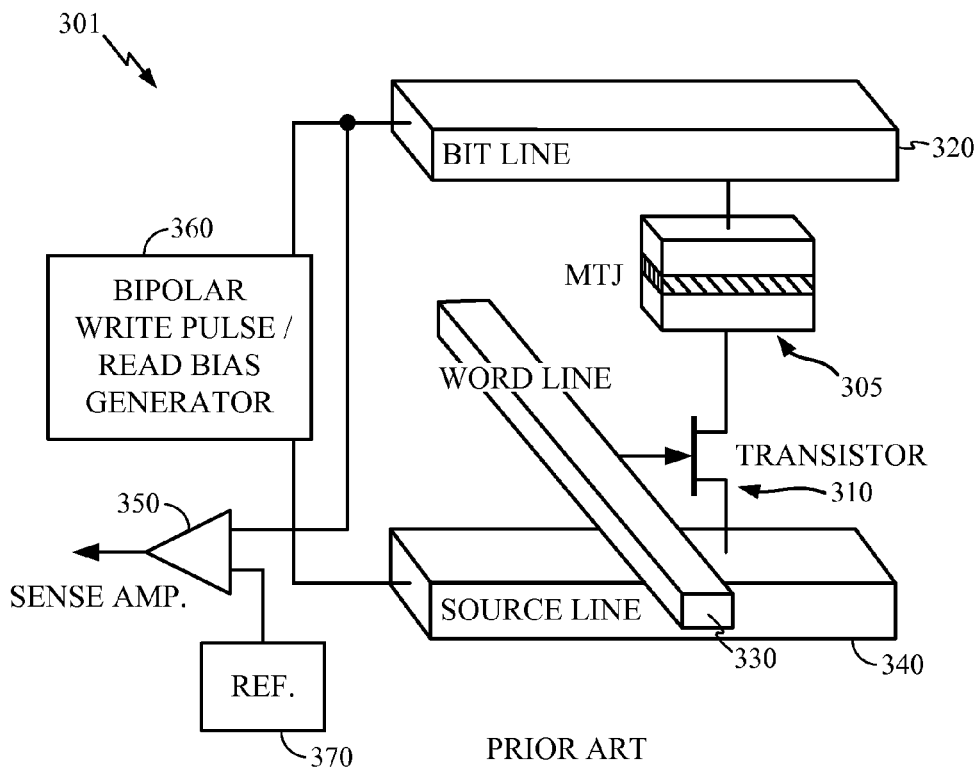
Figure 4:
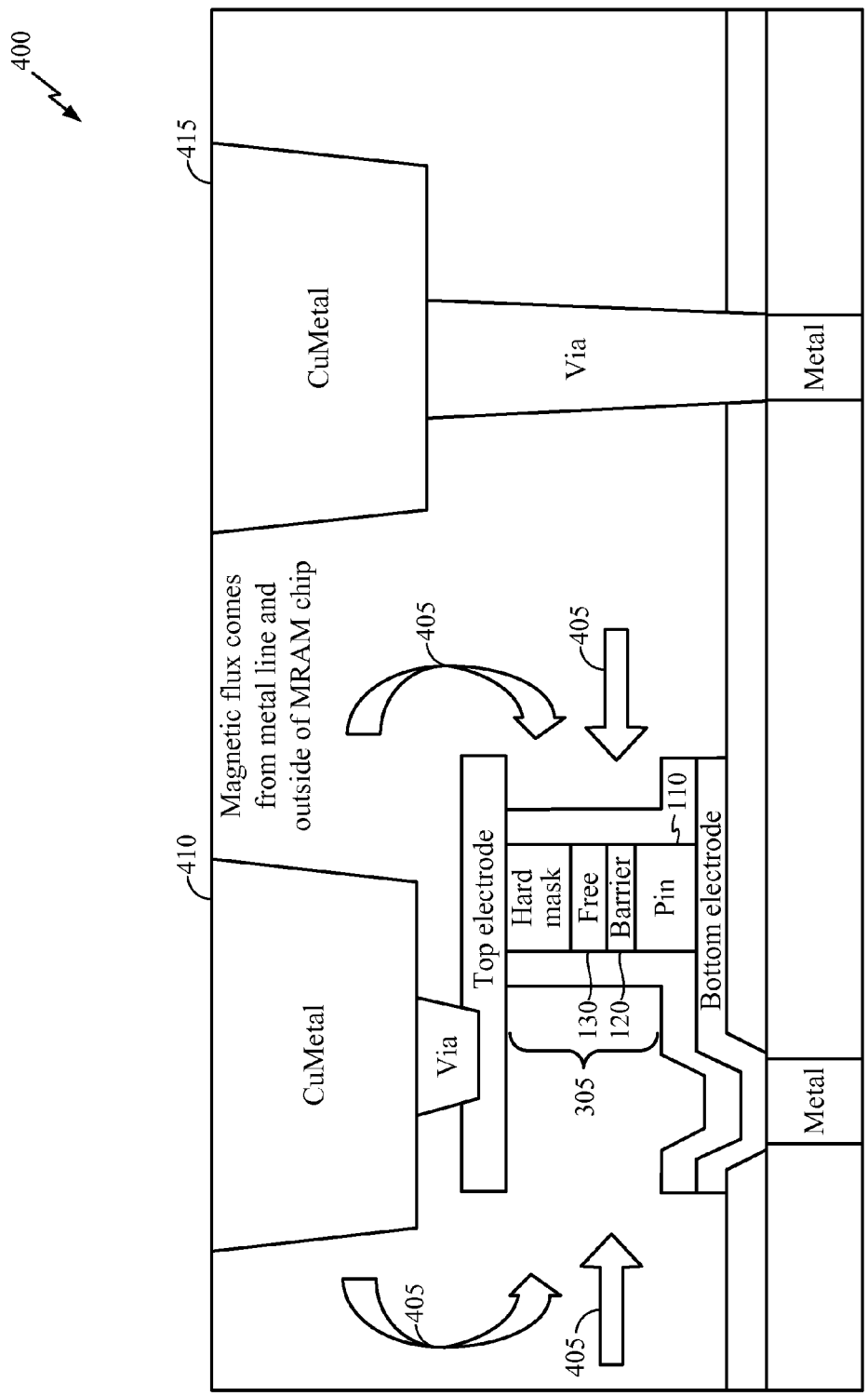
FIG. 4 depicts a performance characteristic of a conventional MTJ.

In accordance with common practice, the various features illustrated in the drawings may not be drawn to scale. Accordingly, the dimensions of the various features may be arbitrarily expanded or reduced for clarity. In accordance with common practice, some of the drawings are simplified for clarity. Thus, the drawings may not depict all components of a given apparatus (e.g., device) or method. Finally, like reference numerals are used to denote like features throughout the specification and figures.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

It should be noted that the terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As employed herein two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

It should be understood that the term "signal" can include any signal such as a data signal, audio signal, video signal, multimedia signal.

Information and signals can be represented using any of a variety of different technologies and techniques. For example, data, instructions, commands, information, signals, bits, symbols, and chips that can be referenced throughout this description can be represented by voltages, currents, electromagnetic waves, magnetic fields or particles, optical fields or particles, or any combination thereof.

It should be understood that any reference to an element herein using a designation such as "first," "second," and so forth does not generally limit the quantity or order of those elements. Rather, these designations can be used herein as a convenient method of distinguishing between two or more elements or instances of an element. Thus, a reference to first and second elements does not mean that only two elements can be employed, or that the first element must precede the second element. Also, unless stated otherwise a set of elements can comprise one or more elements. In addition, terminology of the form "at least one of: A, B, or C" used in the description or the claims means "A or B or C or any combination of these elements."

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Spatial descriptions (e.g., "top," "middle," "bottom," "left," "center," "right," "up," "down," "vertical," "horizontal," etc.) used herein are for illustrative purposes only, and are not limiting descriptors. Practical implementations of the structures described hereby can be spatially arranged in any orientation providing the functions described hereby. In addition, in using the term "adjacent" herein to describe a spatial relationship between integrated circuit elements, the adjacent integrated circuit elements need not be in direct physical contact, and other integrated circuit elements can be located between the adjacent integrated circuit elements.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Introduction

Methods and apparatus for shielding a shielding a non-volatile memory, such as shielding a magnetic tunnel junction (MTJ) device from a magnetic flux are provided. In an example, a shielding layer is formed adjacent to an electrode of an MTJ device, such that the shielding layer substantially surrounds a surface of the electrode, and a metal line is coupled to the shielding layer. The metal line can be coupled to the shielding layer by a via.

Explanation of the Figures

Figure 5:
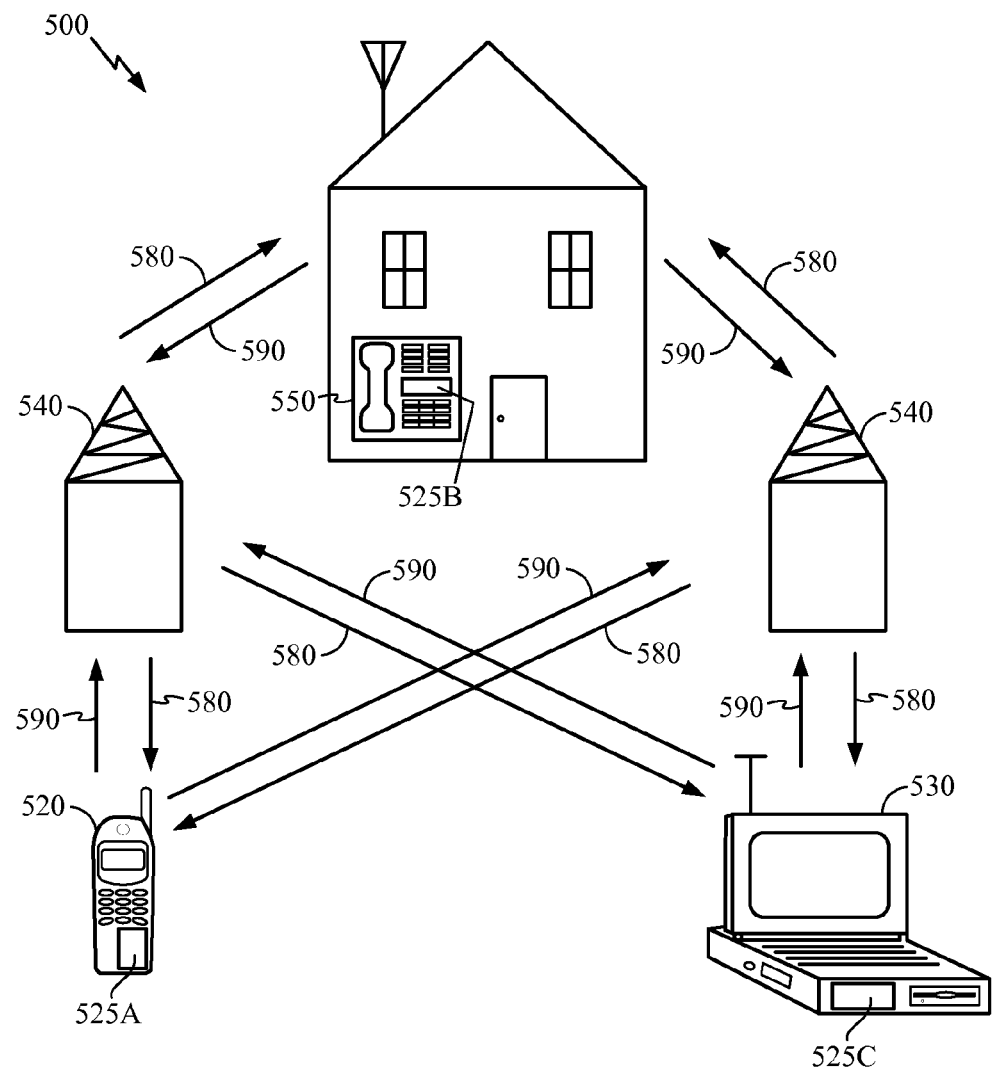
FIG. 5 depicts an exemplary communication system.

FIG. 5 depicts an exemplary communication system 500 in which an embodiment of the disclosure can be advantageously employed. For purposes of illustration, FIG. 5 shows three remote units 520, 530, and 550 and two base stations 540. It will be recognized that conventional wireless communication systems can have many more remote units and base stations. The remote units 520, 530, and 550 include at least a part of an embodiment 525A-C of the disclosure as discussed further herein. FIG. 5 shows forward link signals 580 from the base stations 540 and the remote units 520, 530, and 550, as well as reverse link signals 590 from the remote units 520, 530, and 550 to the base stations 540.

In FIG. 5, remote unit 520 is shown as a mobile telephone, remote unit 530 is shown as a portable computer, and remote unit 550 is shown as a fixed location remote unit in a wireless local loop system. For example, the remote units can be mobile phones, hand-held personal communication systems (PCS) units, portable data units such as personal data assistants, GPS enabled devices, navigation devices, settop boxes, music players, video players, entertainment units, fixed location data units such as meter reading equipment, receivers, or any other device that stores or retrieves data or computer instructions, or any combination thereof. Although FIG. 5 illustrates remote units according to the teachings of the disclosure, the disclosure is not limited to these exemplary illustrated units. Embodiments of the disclosure can be suitably employed in any device which includes an MTJ device.

FIGS. 6A-E depict cross-sectional layer views of portions of MTJ elements including shielding according to exemplary embodiments.

Figure 6A:
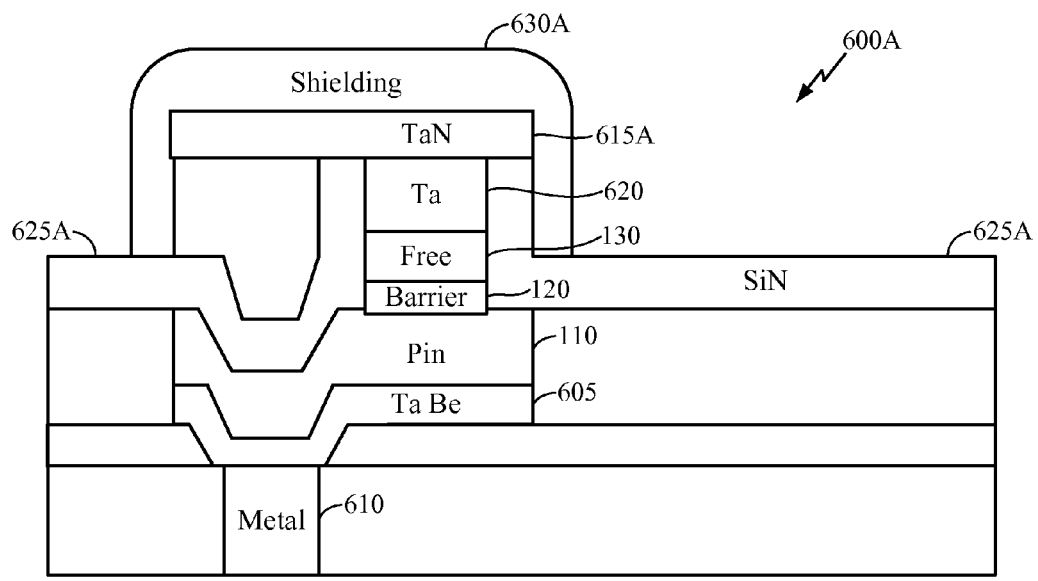
FIGS. 6A-E depict cross-sectional layer views of portions of MTJ elements including shielding.

FIG. 6A depicts a shielded MTJ structure 600A. The shielded MTJ structure 600A includes the pin layer 110, the barrier layer 120, and the free layer 130. The pin layer 110 is coupled to a bottom electrode 605 and a metal layer 610. The free layer 130 is coupled to a top electrode 615A via a hard mask 620. Insulator 625A insulates the hard mask 620, the free layer 130, and the barrier layer 120. Shielding 630A, which has a U-shaped cross section, shields at least a part of each of the top electrode 615A, the hard mask 620, and the free layer 130. The shielding 630A has a cap-shaped structure within which is located at least a part of each of the hard mask 620, the free layer 130, and the top electrode 615A.

Figure 6B:
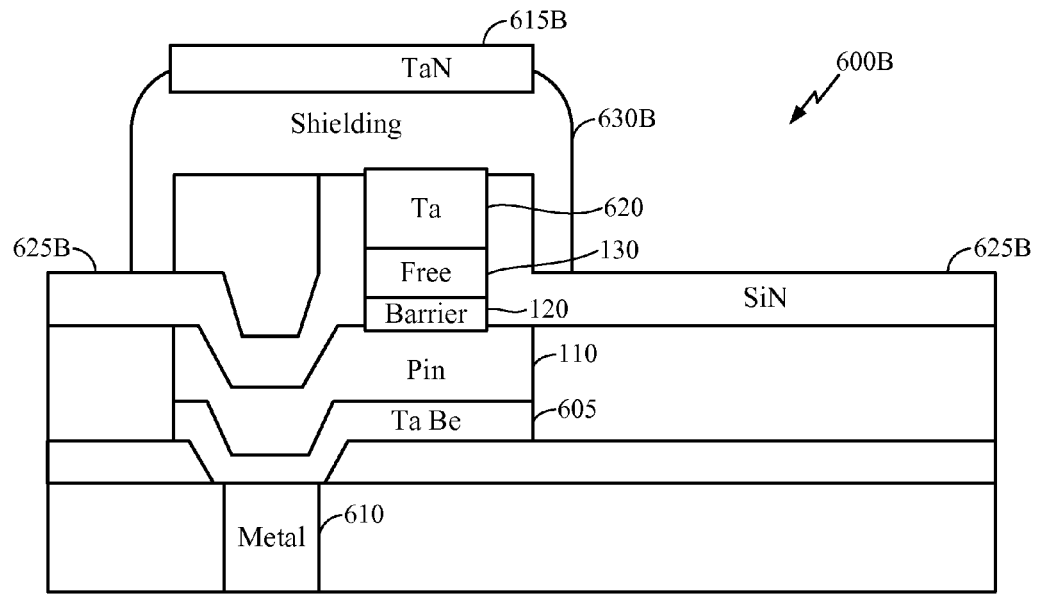

FIG. 6B depicts a shielded MTJ structure 600B. The shielded MTJ structure 600B includes the pin layer 110, the barrier layer 120, and the free layer 130. The pin layer 110 is coupled to the bottom electrode 605 and the metal contact 610. The free layer 130 is coupled to a top electrode 615B via the hard mask 620 and shielding 630B. An insulator 625B insulates the hard mask 620, the free layer 130, and the barrier layer 120. The shielding 630B shields at least a part of each of the hard mask 620, the free layer 130, and the barrier layer 120. The shielding 630B has a cap-shaped structure within which is located at least a part of each of the hard mask 620, the free layer 130, and the top electrode 615B.

Figure 6C:
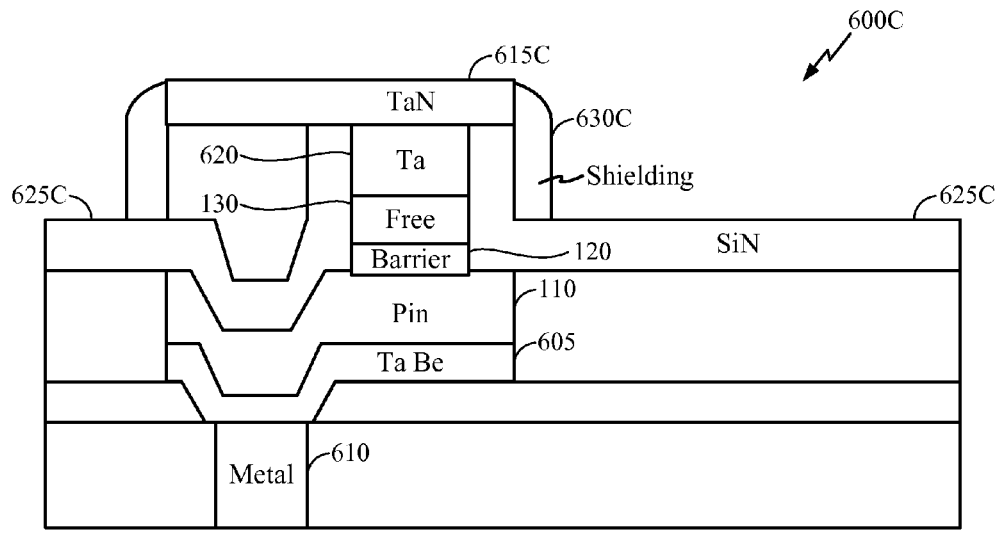

FIG. 6C depicts a shielded MTJ structure 600C. The shielded MTJ structure 600C includes the pin layer 110, the barrier layer 120, and the free layer 130. The pin layer 110 is coupled to the bottom electrode 605 and the metal contact 610. The free layer 130 is coupled to a top electrode 615C via the hard mask 620. An insulator 625C insulates the hard mask 620, the free layer 130, and the barrier layer 120. The shielding 630C shields at least a part of each of the hard mask 620, the free layer 130, the barrier layer 120, and the top electrode 615C. The shielding 630C has a structure within which is located at least a part of each of the hard mask 620, the free layer 130, and the top electrode 615C.

Figure 6D:
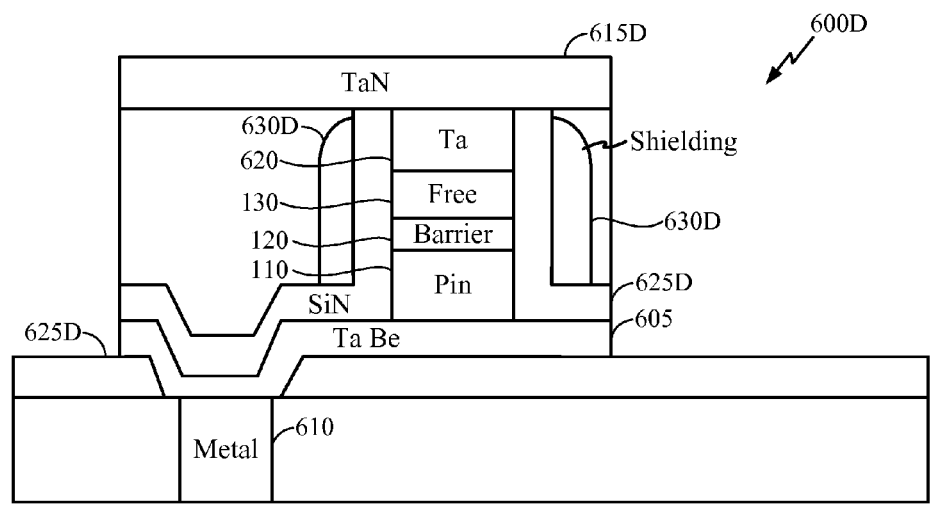

FIG. 6D depicts a shielded MTJ structure 600D. The shielded MTJ structure 600D includes the pin layer 110, the barrier layer 120, and the free layer 130. The pin layer 110 is coupled to the bottom electrode 605 and the metal contact 610. The free layer 130 is coupled to a top electrode 615D via the hard mask 620. An insulator 625D insulates the hard mask 620, the free layer 130, the barrier layer 120, and the pin layer 110. The shielding 630D shields at least a part of each of the hard mask 620, the free layer 130, the barrier layer 120, and the pin layer 110. The shielding 630D has a structure within which is located at least a part of each of the hard mask 620, the free layer 130, the pin layer 110, and the insulator 625D.

Figure 6E:
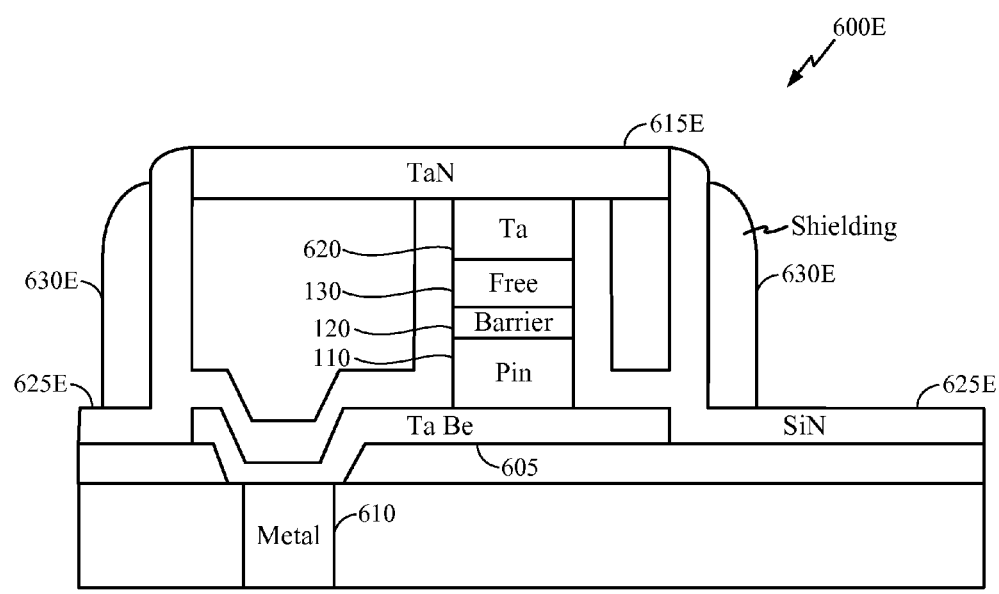

FIG. 6E depicts a shielded MTJ structure 600E. The shielded MTJ structure 600E includes the pin layer 110, the barrier layer 120, and the free layer 130. The pin layer 110 is coupled to the bottom electrode 605 and the metal contact 610. The free layer 130 is coupled to a top electrode 615E via the hard mask 620. An insulator 625E insulates at least a part of the hard mask 620, the free layer 130, the barrier layer 120, the pin layer 110, and the top electrode 615E. The shielding 630E shields at least a part of each of the hard mask 620, the free layer 130, the barrier layer 120, the pin layer 110, and the top electrode 615E. The shielding 630E has a structure within which is located at least a part of each of the hard mask 620, the free layer 130, the barrier layer 120, the pin layer 110, and the top electrode 615E.

In an example, the top electrode 615A-E is formed from TaN, the shielding 630A-E is formed from NiFe, Fe, or other high magnetic permeability materials; the insulator 625A-E is formed from SiN; and both the hard mask 620 and the bottom electrodes are formed from Ta.

FIGS. 7A-7J, 8A-8F, 9A-9J, 10A-10H, and 11A-11I describe exemplary steps for forming a shielded MTJ structure, according to embodiments. Not all steps described hereby need be performed in all embodiments. Further, the shielded MTJ structure can be formed according to processes other than those described hereby.

FIGS. 7A-7J and 8A-8F describe steps to form both the shielded MTJ structure 600A and the shielded MTJ structure 600B.

Figure 7A:
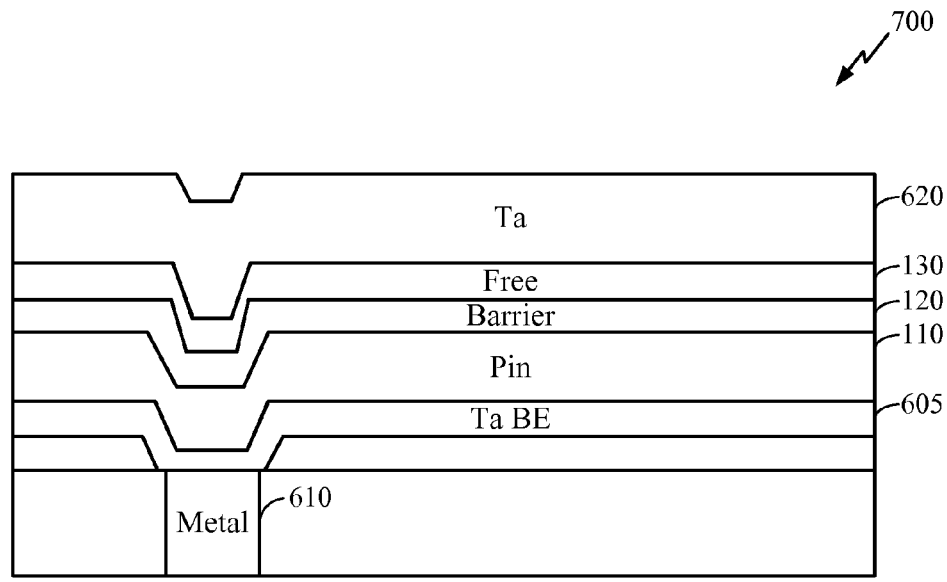
FIGS. 7A-7J describe steps to form a shielded MTJ structure.

FIG. 7A depicts step 700, in which the metal layer 610 is formed on a substrate. Layers of materials from which the hard mask 620, free layer 130, barrier layer 120, pin layer 110, bottom electrode 605 are to be formed are deposited on the metal layer 610. The layers can be applied in any manner, conventional or otherwise, as would be known to persons skilled in the relevant art(s). For example, the layers can be formed by sputtering, chemical vapor deposition, plating, lithographic processes, etc.

Figure 7B:
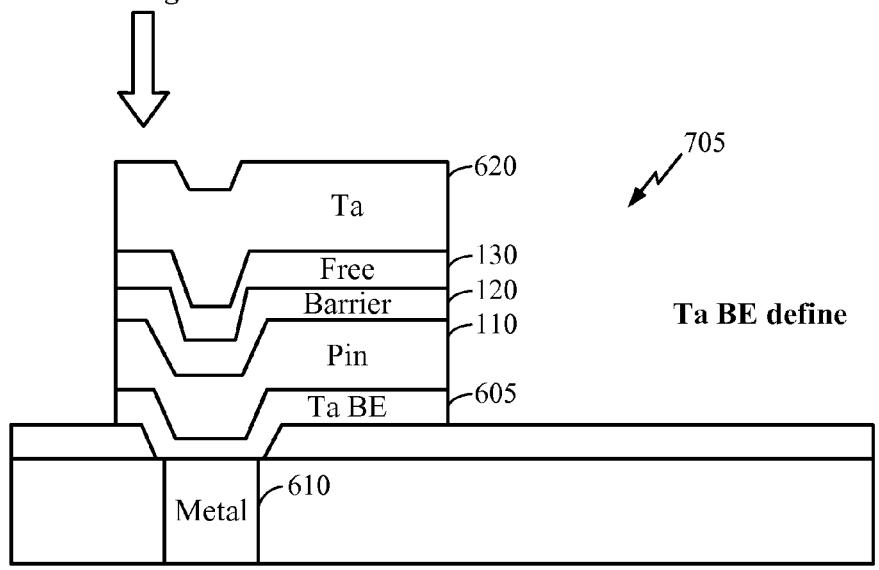

FIG. 7B depicts step 705, in which material is removed to define the bottom electrode 605 and the pin layer 110. Removal can be by etching, milling, or in any manner, conventional or otherwise, as would be known to persons skilled in the relevant art(s).

Figure 7C:
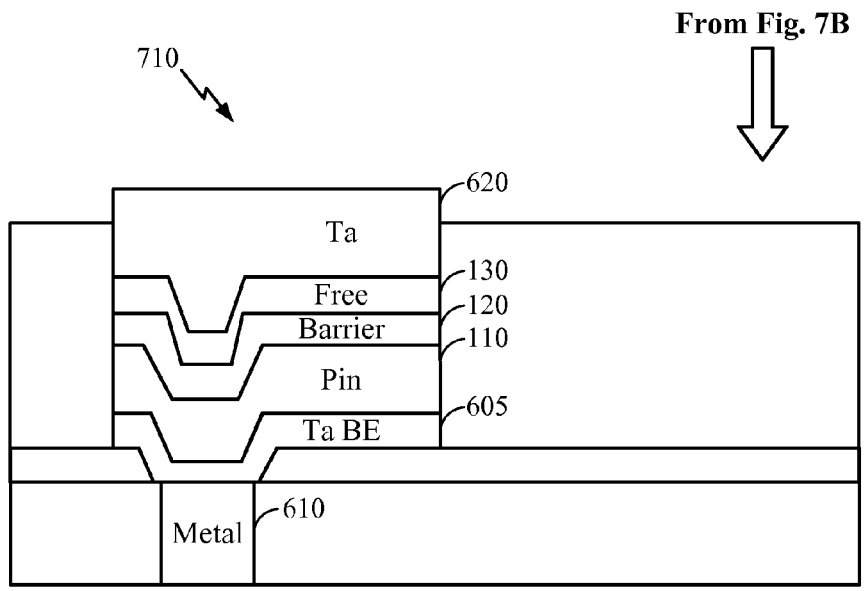

FIG. 7C depicts step 710, in which a dielectric or extremely low-K film is applied to protect the substrate and process planarization.

Figure 7D:
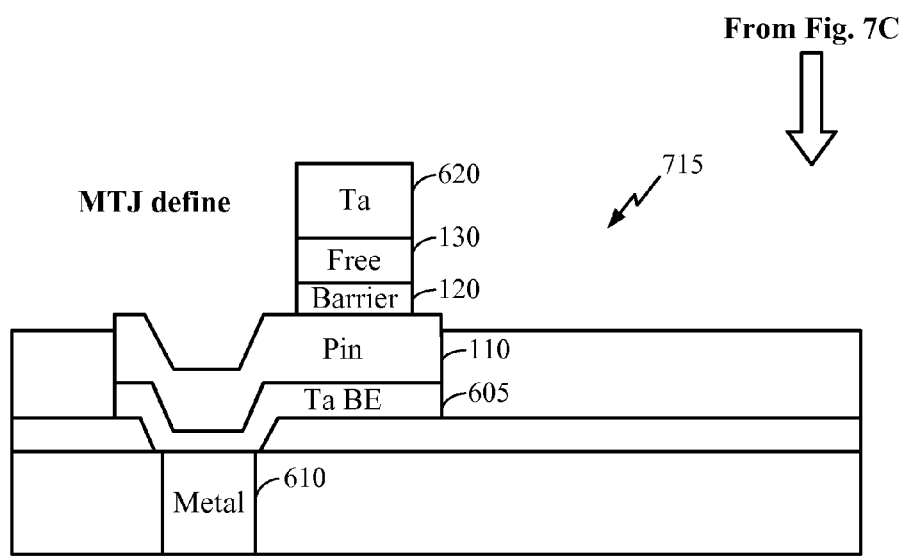

FIG. 7D depicts step 715, material is removed to form an MTJ device having the hard mask 620, the free layer 130, and the barrier layer 120.

Figure 7E:
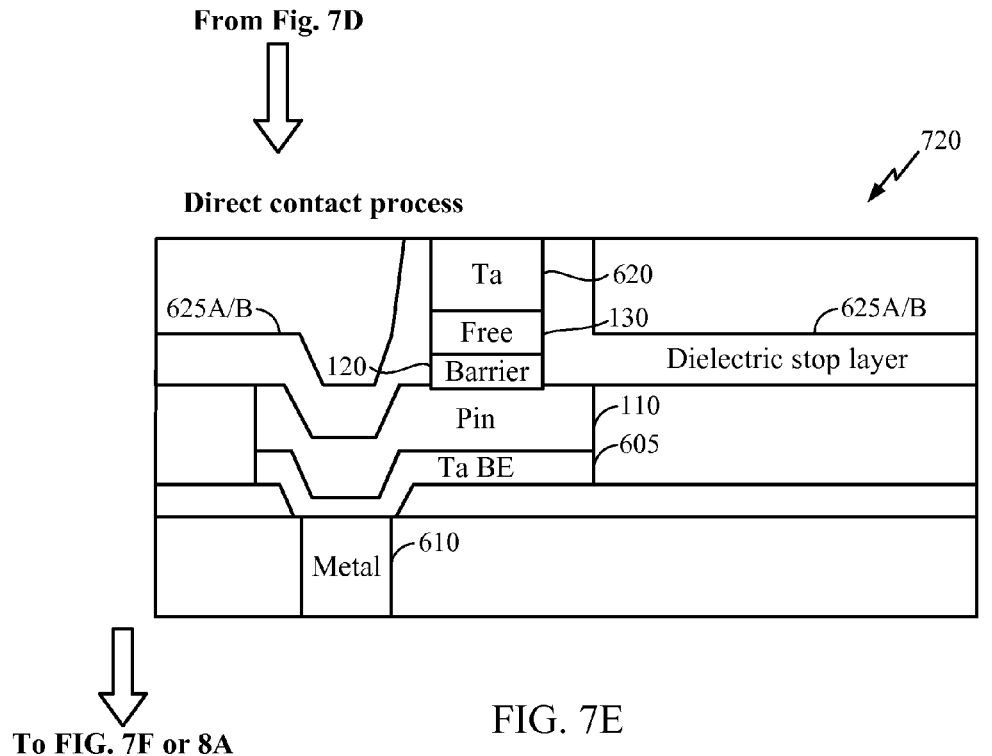

FIG. 7E depicts step 720, in which the insulating layer 625A-B is formed. At this point, the process can proceed to either step 725, or step 800 depicted in FIG. 8A.

Figure 7F:
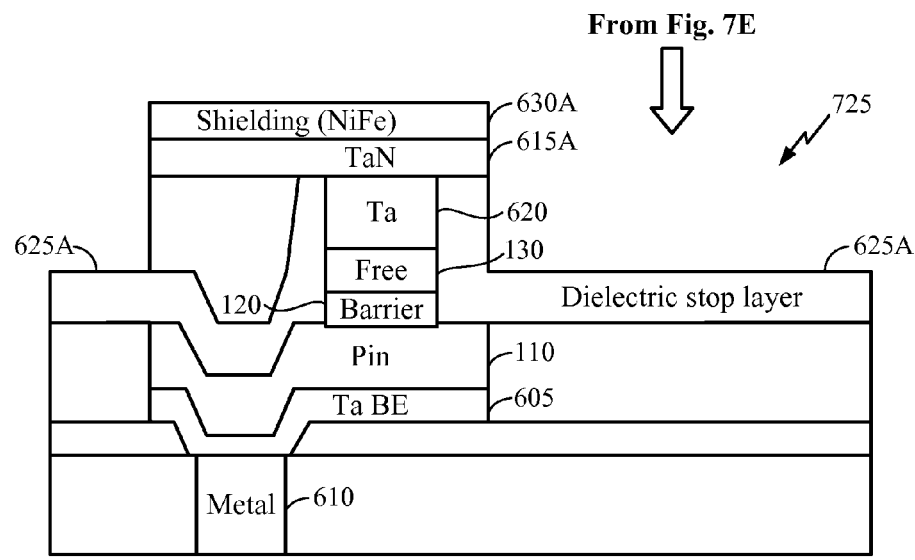

FIG. 7F depicts step 725, in which the top electrode 615A is formed on the hard mask 620, and the shielding 630A is formed on the top electrode 615A.

Figure 7G:
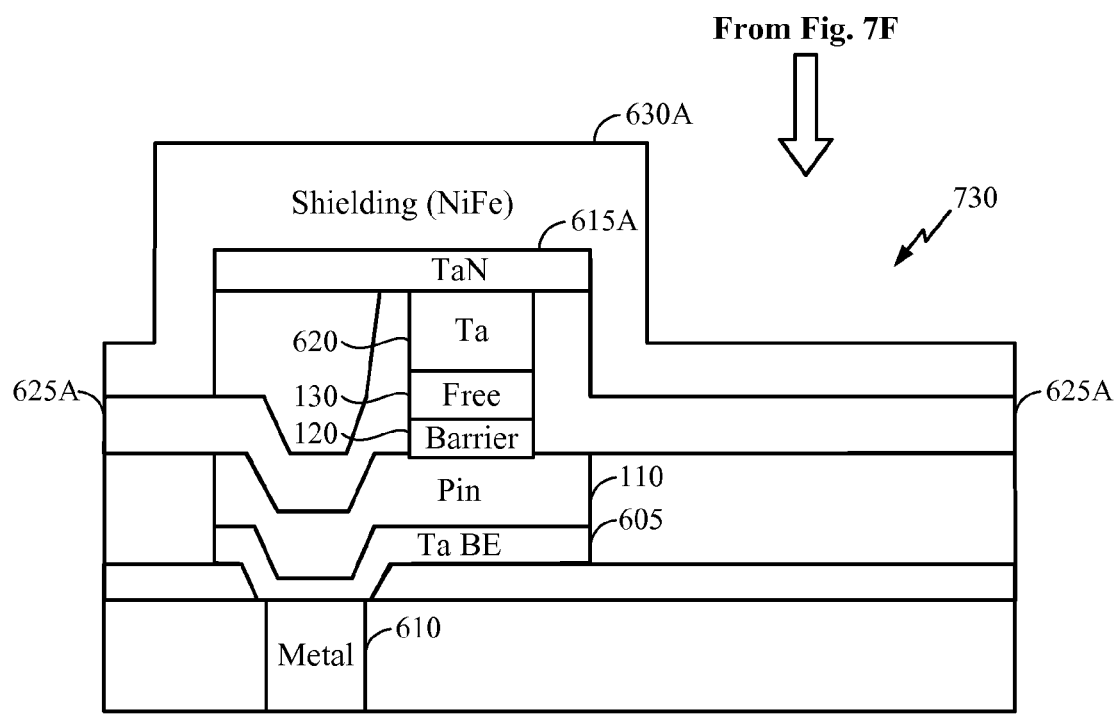

FIG. 7G depicts step 730, in which additional material of the shielding 630A is formed on both the top electrode 615A and the insulating layer 625A.

Figure 7H:
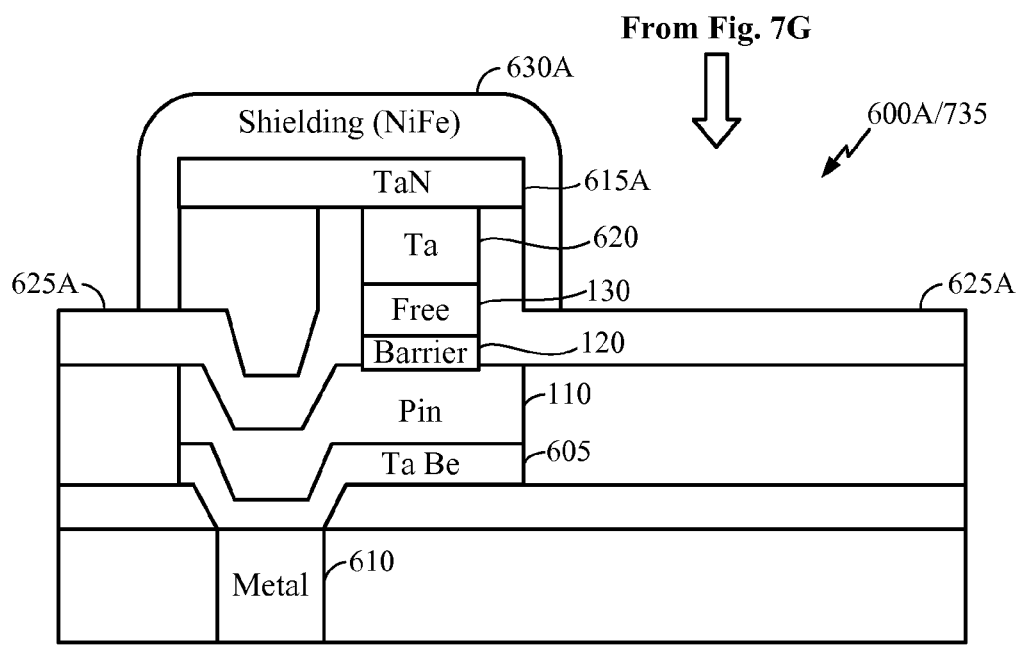

FIG. 7H depicts step 735, which can produce the shielded MTJ structure 600A, in which the shielding layer 630A is etched back to form a shielding spacer. In an example, the shielding 630A is etched to a thickness of between 10-400 angstroms. Steps 700-735 form the shielded MTJ structure 600A. At this point, the process proceeds to either step 740 or step 745.

Figure 7I:
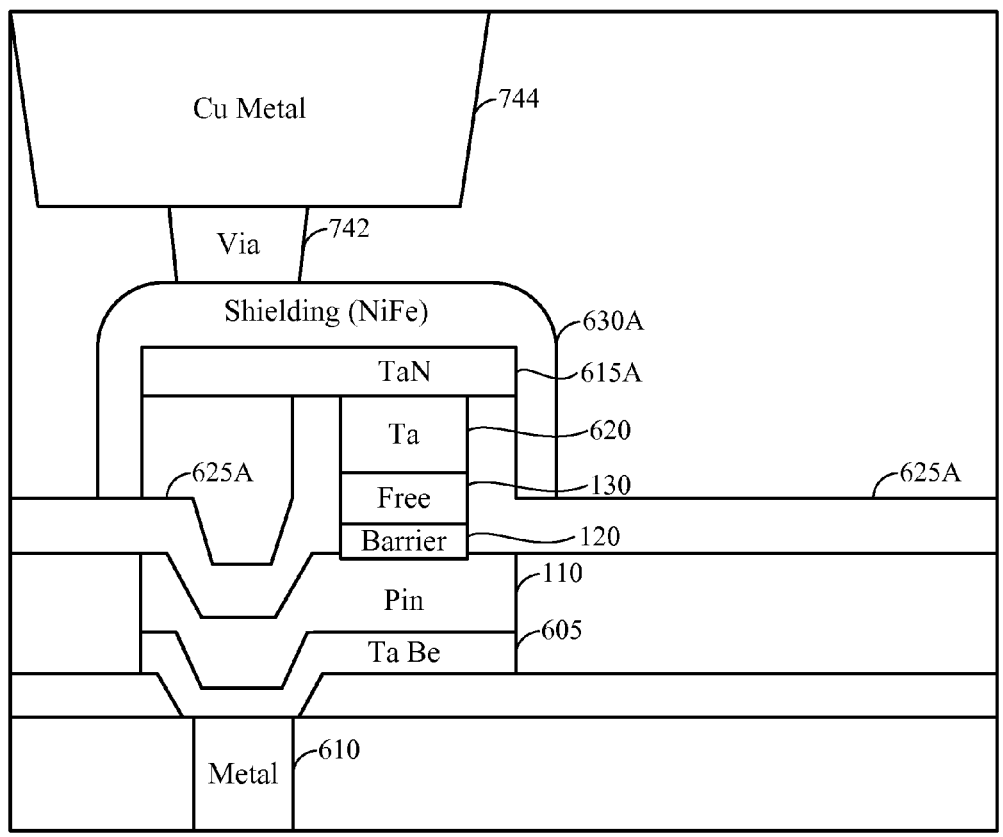

FIG. 7I depicts step 740, in which a via 742 and a metal line 744 are formed on the shielding 630A. The metal line 744 can be formed of any suitable electrically conductive material, including copper, aluminum, gold, silver, nickel, tin, titanium, and/or a combination of metals, etc.

Figure 7J:
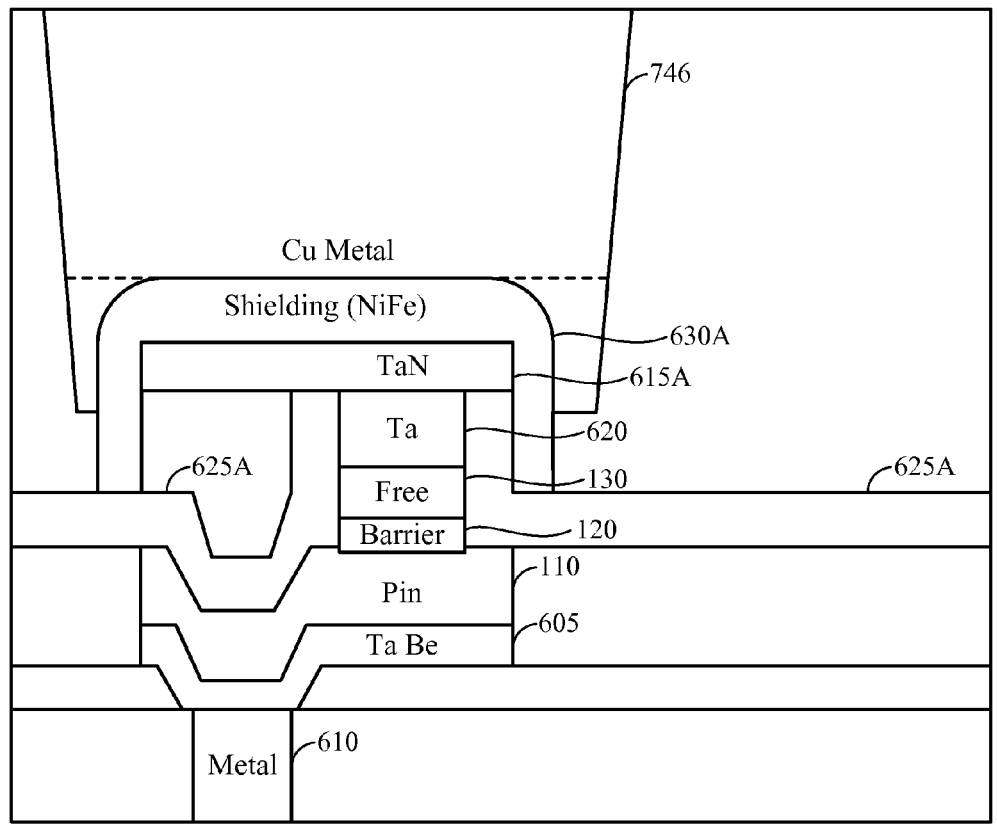

FIG. 7J depicts step 745, in which a metal line 746 is formed on the shielding layer 630A. The metal line 746 can be formed of any suitable electrically conductive material, including copper, aluminum, gold, silver, nickel, tin, titanium, and/or a combination of metals, etc.

Figure 8A:
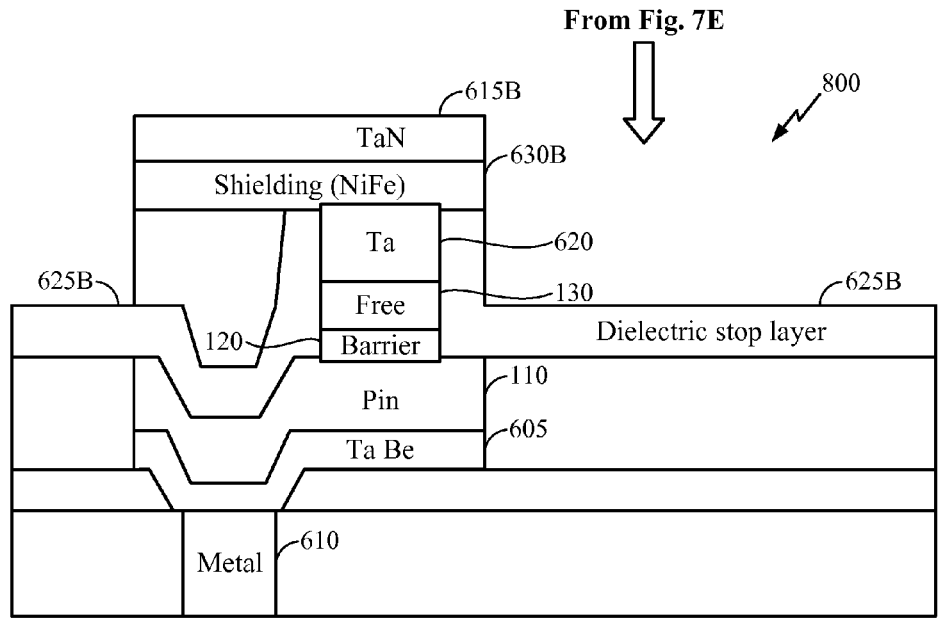
FIGS. 8A-8F describe steps to form another shielded MTJ structure.

FIG. 8A depicts step 800, in which the shielding layer 630B is formed on the hard mask 620, and the top electrode 615B is formed on the shielding 630B.

Figure 8B:
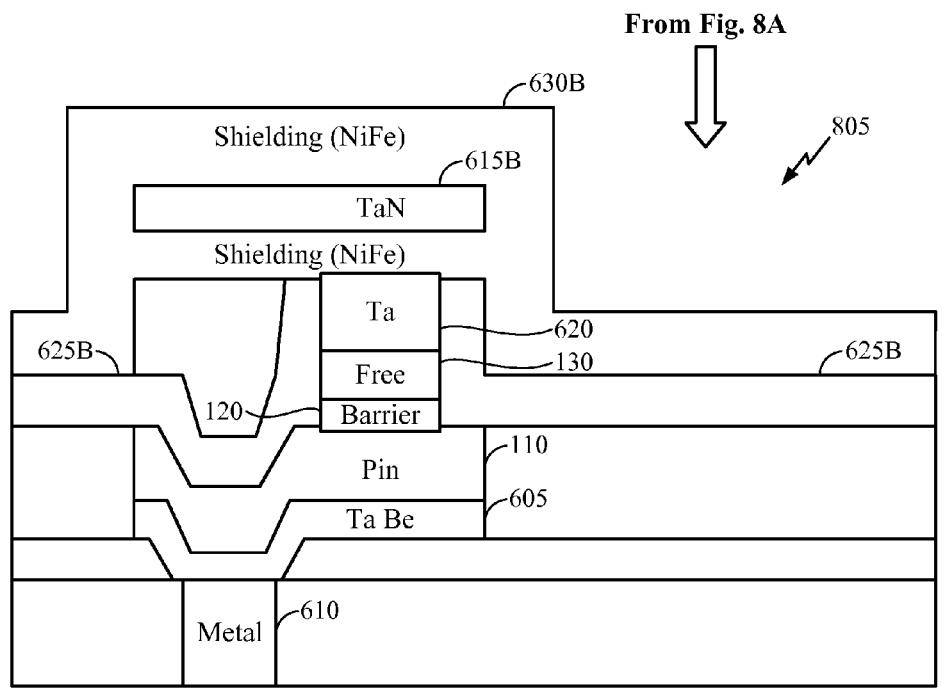

FIG. 8B depicts step 805, in which additional material of the shielding layer 630B is formed on both the top electrode 615B and the insulating layer 625B.

Figure 8C:
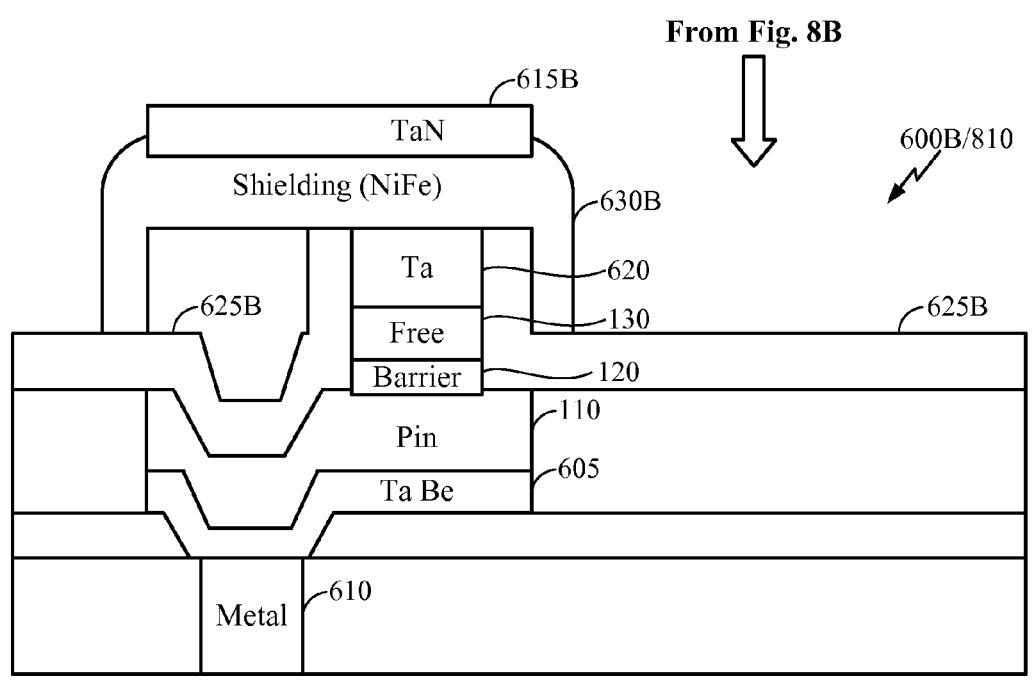
Figure 8D:
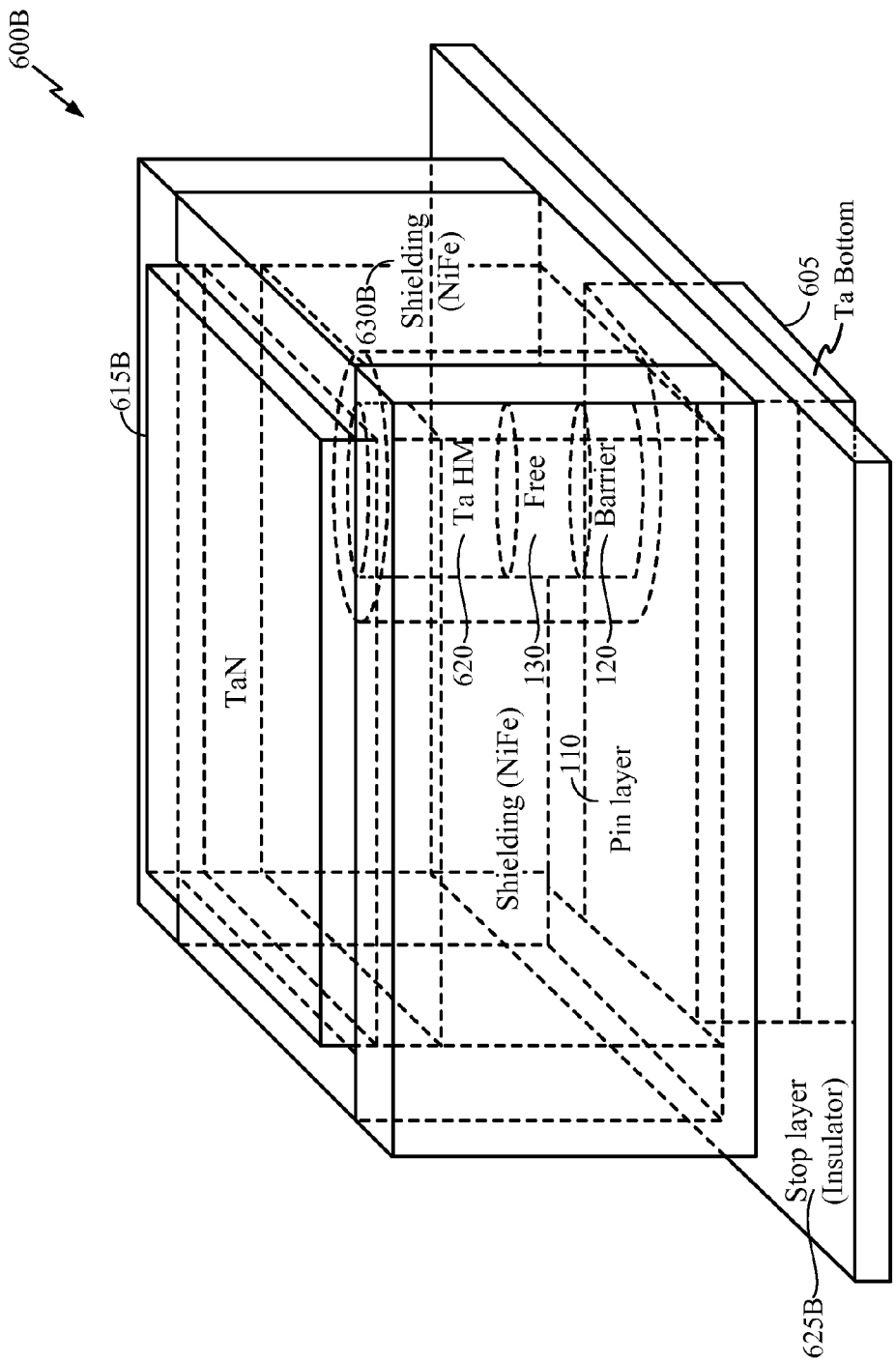

FIG. 8C depicts step 810, in which in which the shielding 630B is etched back to expose the top electrode 615B, and form the shielding layer 630B into a cap-shaped structure. Step 810 can produce the shielded MTJ structure 600B. Steps 700-720 and 800-810 form the shielded MTJ structure 600B. At this point, the process proceeds to either step 815 or step 820. FIG. 8D provides a perspective view of the shielded MTJ structure 600B, including the pin layer 110, the barrier layer 120, the free layer 130, the hard mask 620, the top electrode 615B, the shielding 630B, the bottom electrode 605, and the insulator 625B.

Figure 8E:
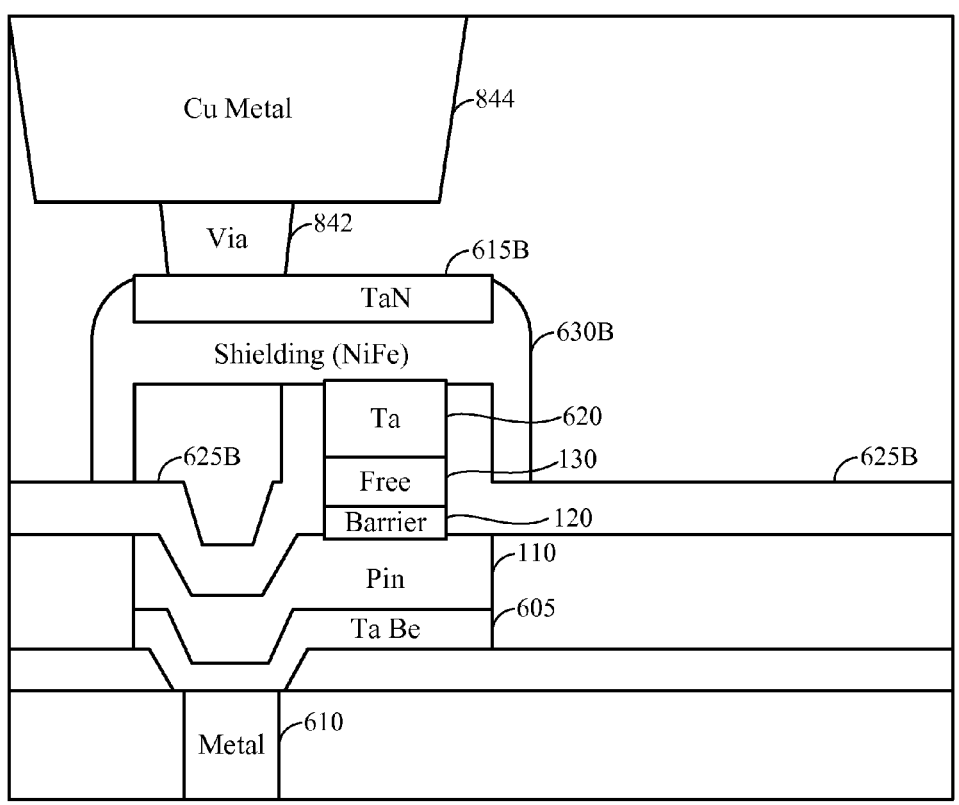

FIG. 8E depicts step 815, in which a via 842 and a metal line 844 are formed on the top electrode 615B. The metal line 844 can be formed of any suitable electrically conductive material, including copper, aluminum, gold, silver, nickel, tin, titanium, and/or a combination of metals, etc.

Figure 8F:
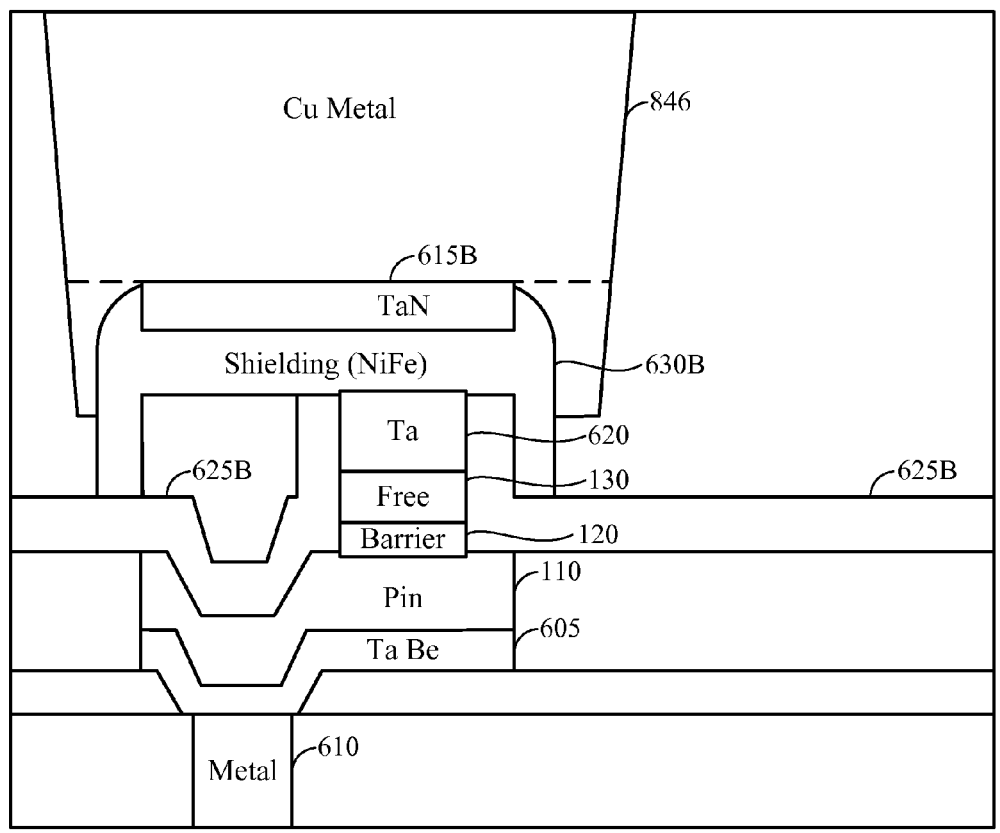

FIG. 8F depicts step 820, in which a metal line 846 is formed on the top electrode 615B. The metal line 846 can be formed of any suitable electrically conductive material, including copper, aluminum, gold, silver, nickel, tin, titanium, and/or a combination of metals, etc.

FIGS. 9A-9J describe steps to form the shielded MTJ structure 600C.

Figure 9A:
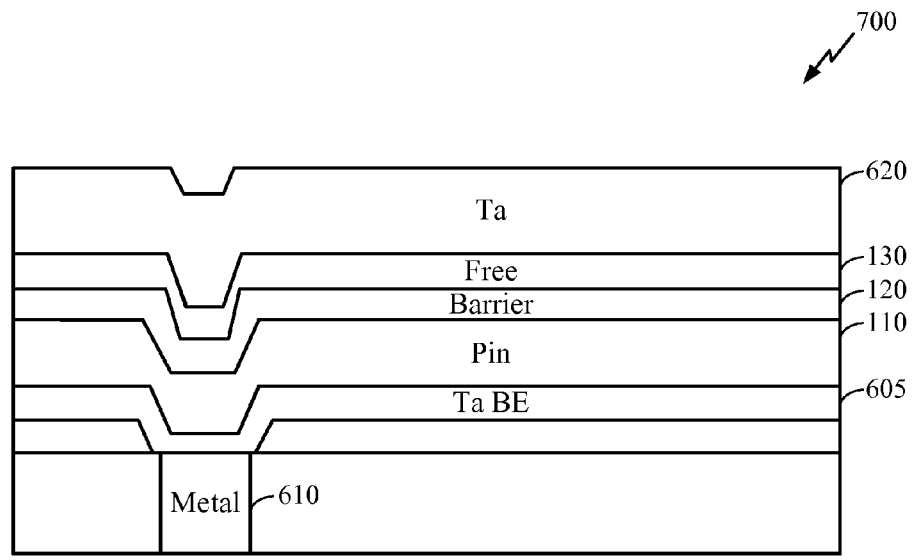
FIGS. 9A-9J describe steps to form another shielded MTJ structure.

FIG. 9A depicts step 900, in which the metal layer 610 is formed on a substrate. Layers of materials from which the hard mask 620, free layer 130, barrier layer 120, pin layer 110, bottom electrode 605 are to be formed are deposited on the metal layer 610. The layers can be applied in any manner, conventional or otherwise, as would be known to persons skilled in the relevant art(s). For example, the layers can be formed by sputtering, chemical vapor deposition, plating, lithographic processes, etc.

Figure 9B:
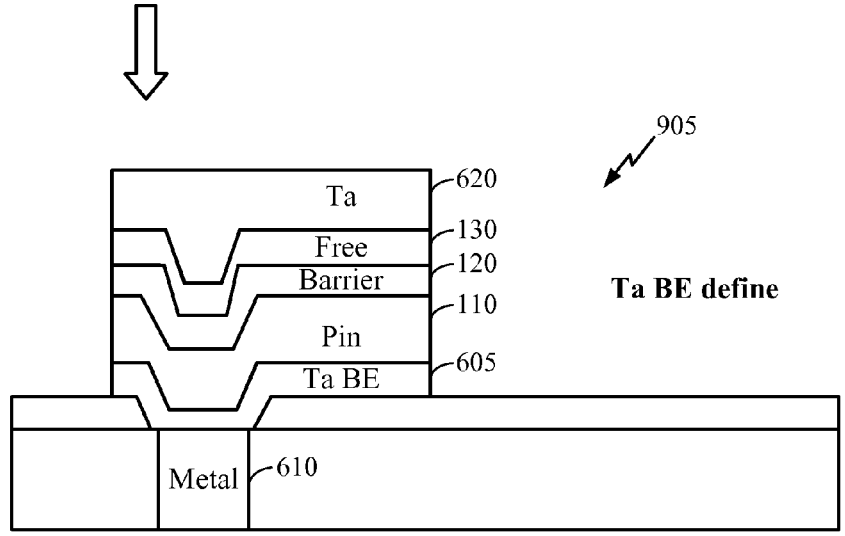

FIG. 9B depicts step 905, in which material is removed to define the bottom electrode 605 and the pin layer 110. Removal can be by etching, milling, or in any manner, conventional or otherwise, as would be known to persons skilled in the relevant art(s).

Figure 9C:
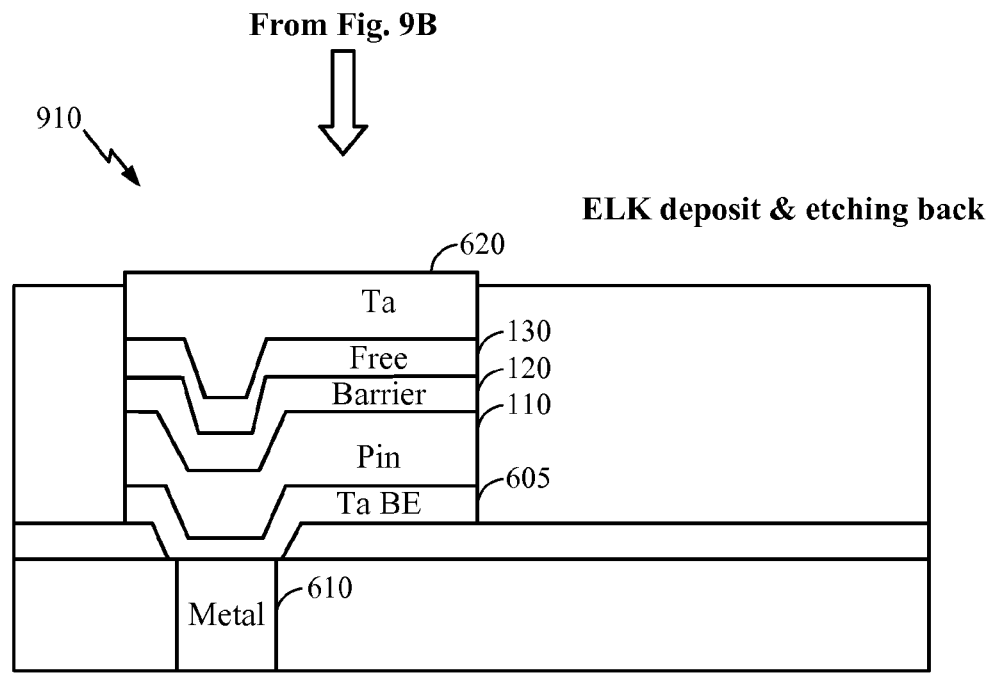

FIG. 9C depicts step 910, in which a dielectric or extremely low-K film is applied to protect the substrate and process planarization.

Figure 9D:
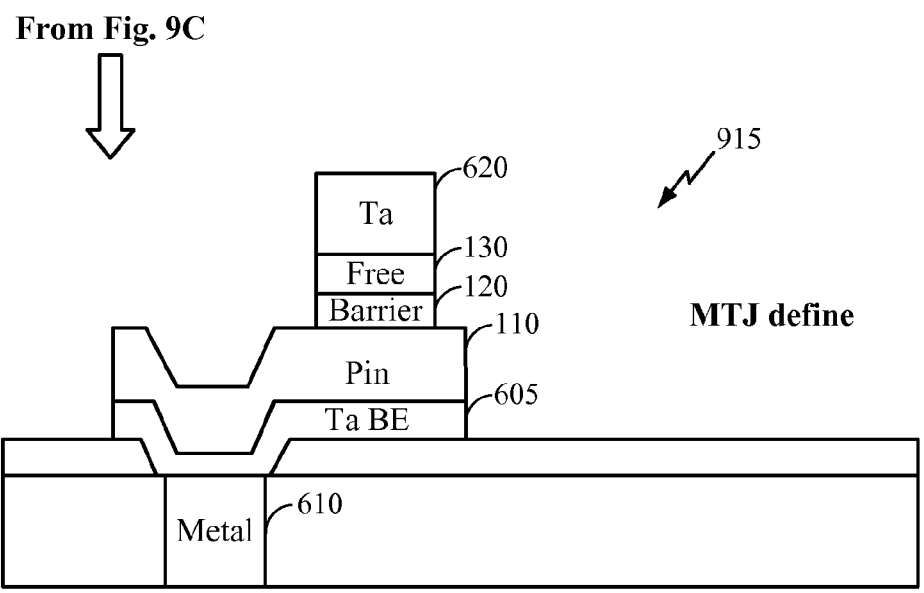

FIG. 9D depicts step 915, material is removed to form an MTJ device having the hard mask 620, the free layer 130, and the barrier layer 120.

Figure 9E:
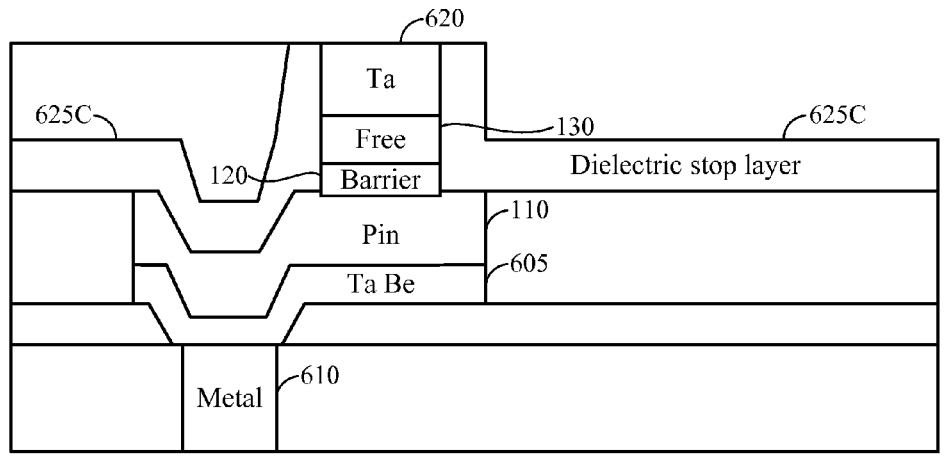

FIG. 9E depicts step 920, in which the insulating layer 625C is formed around the hard mask 620, the free layer 130, and the barrier layer 120.

Figure 9F:
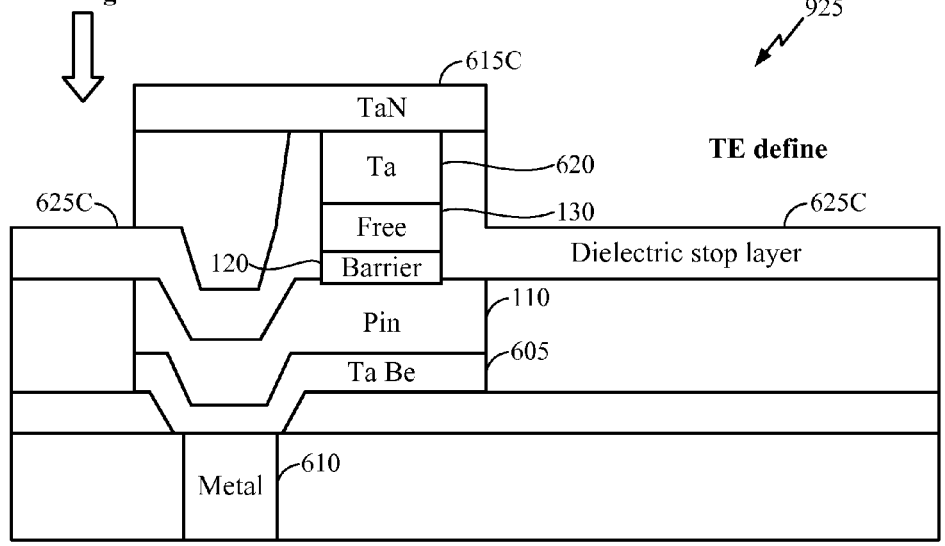

FIG. 9F depicts step 925, in which the top electrode 615C is formed on the hard mask 620.

Figure 9G:
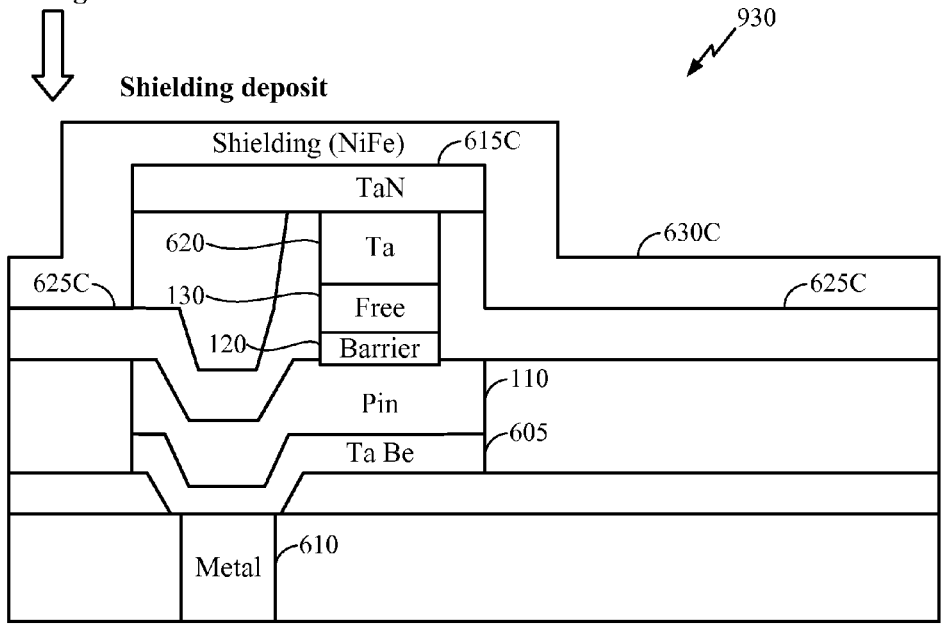

FIG. 9G depicts step 930, in which the shielding 630C is formed on the top electrode 615C and the insulating layer 625C.

Figure 9H:
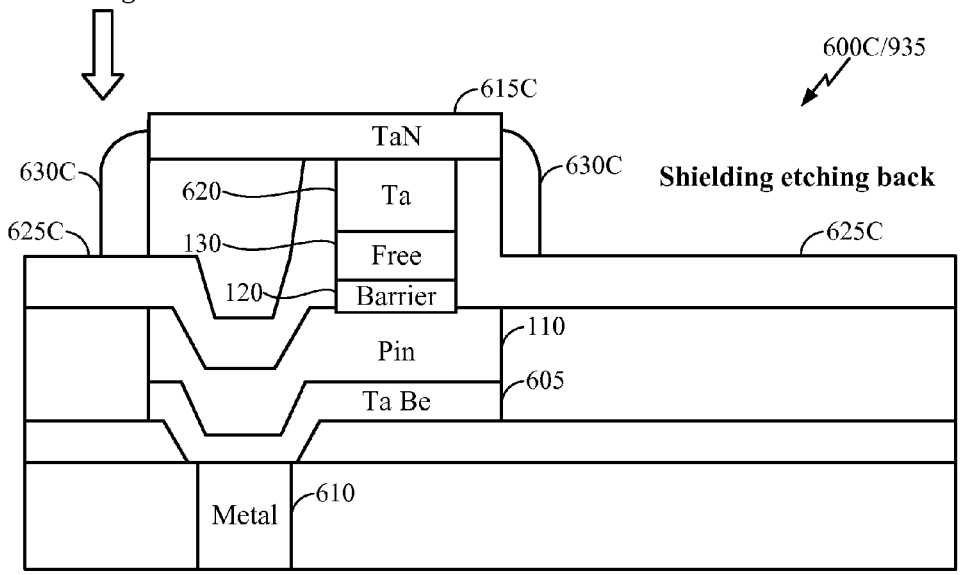

FIG. 9H depicts step 935, in which the shielding 630C is etched back to form the shielding spacer and to expose the top electrode 615C, and remove the shielding 630C from the insulating layer 625C. Steps 900-935 form the shielded MTJ structure 600C. At this point, the process proceeds to either step 940, or step 945.

Figure 9I:
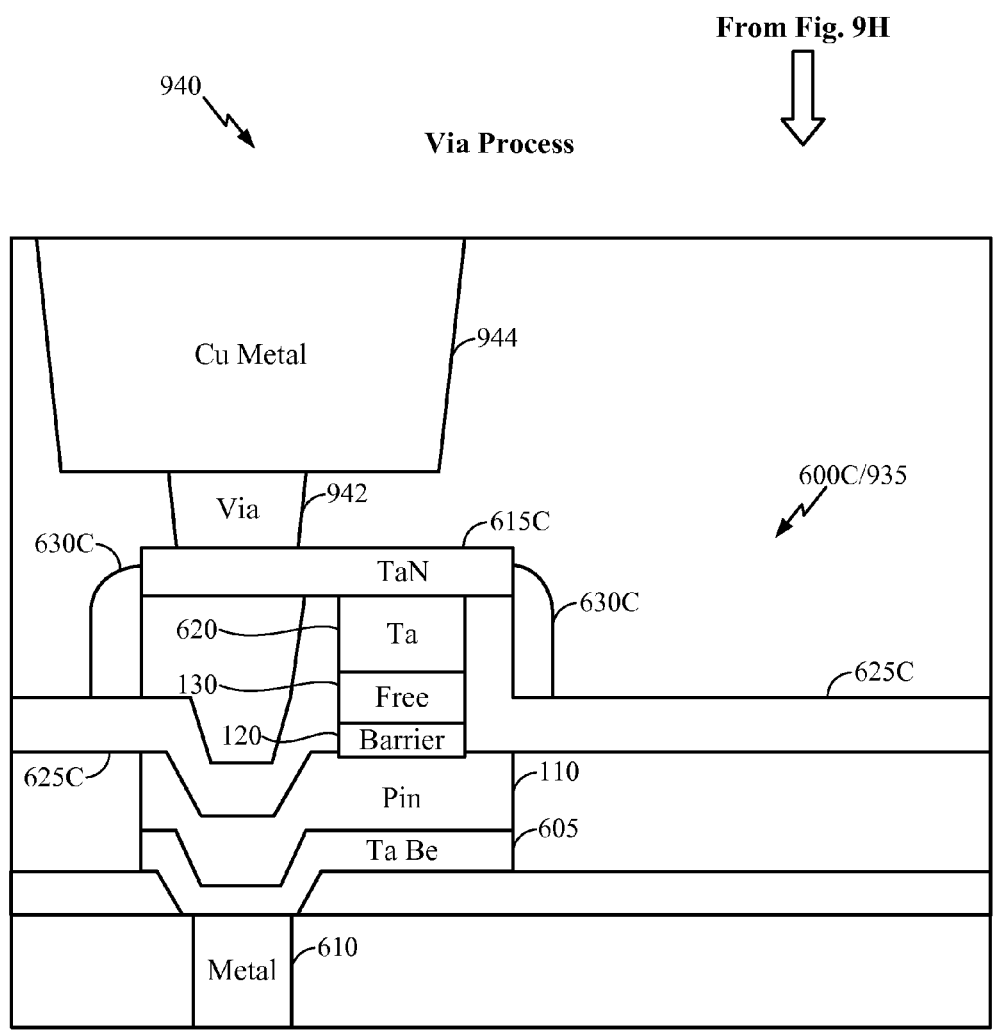

FIG. 9I depicts step 940, in which a via 942 and a metal line 944 are formed on the top electrode 615C. The metal line 944 can be formed of any suitable electrically conductive material, including copper, aluminum, gold, silver, nickel, tin, titanium, and/or a combination of metals, etc.

Figure 9J:
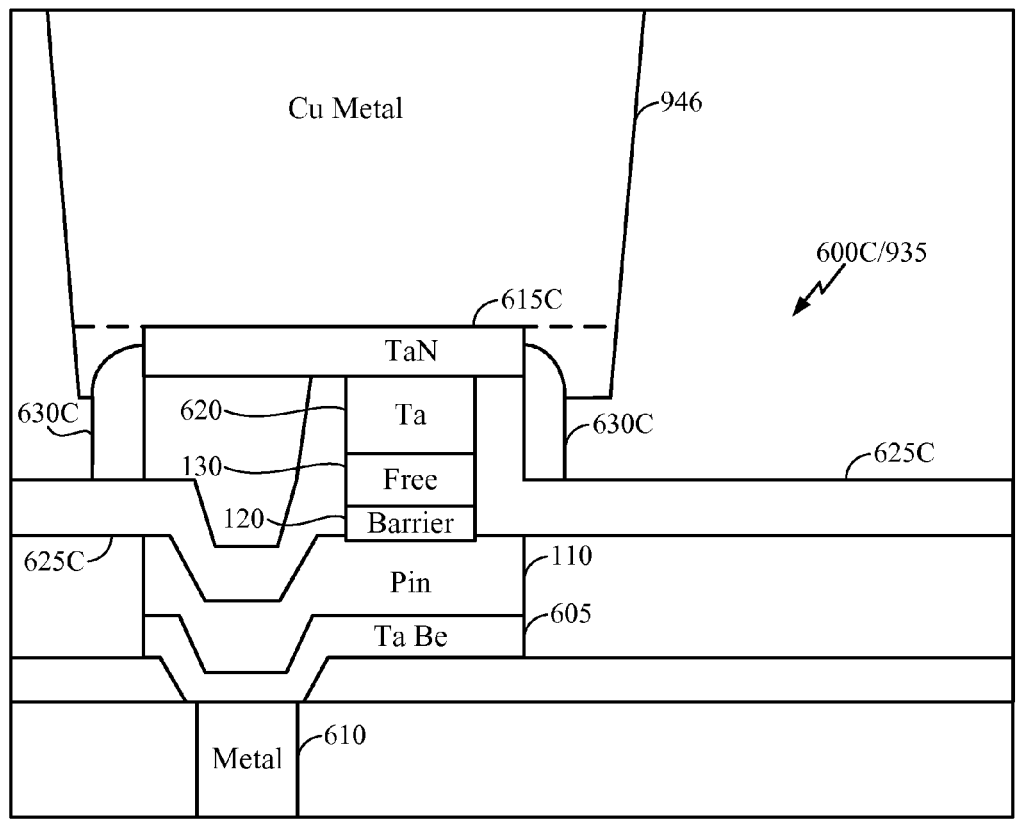

FIG. 9J depicts step 945, in which a metal line 946 is formed on the top electrode 615C.

The metal line 946 can be formed of any suitable electrically conductive material, including copper, aluminum, gold, silver, nickel, tin, titanium, and/or a combination of metals, etc.

FIGS. 10A-10H describe steps to form the shielded MTJ structure 600D.

Figure 10A:
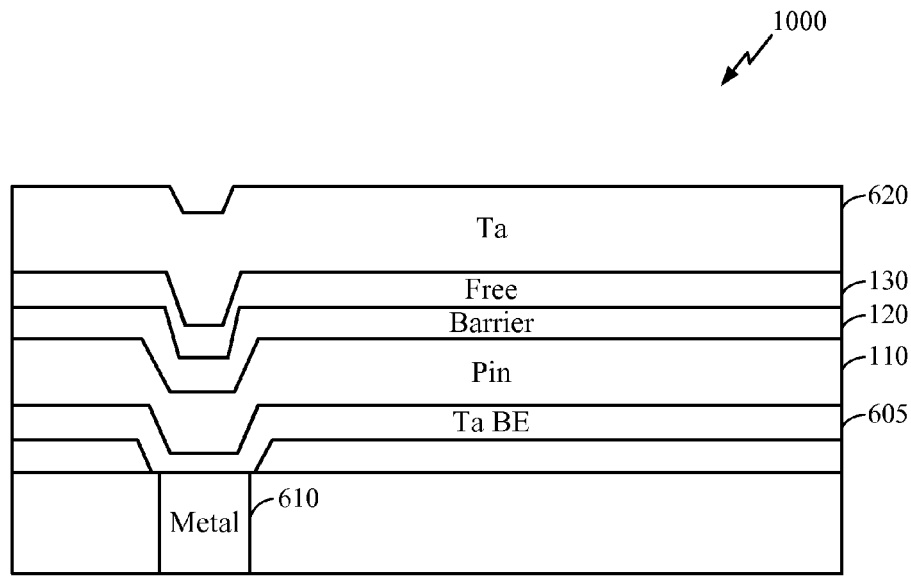
FIGS. 10A-10H describe steps to form another shielded MTJ structure.

FIG. 10A depicts step 1000, in which the metal layer 610 is formed on a substrate. Layers of materials from which the hard mask 620, free layer 130, barrier layer 120, pin layer 110, bottom electrode 605 are to be formed are deposited on the metal layer 610. The layers can be applied in any manner, conventional or otherwise, as would be known to persons skilled in the relevant art(s). For example, the layers can be formed by sputtering, chemical vapor deposition, plating, lithographic processes, etc.

Figure 10B:
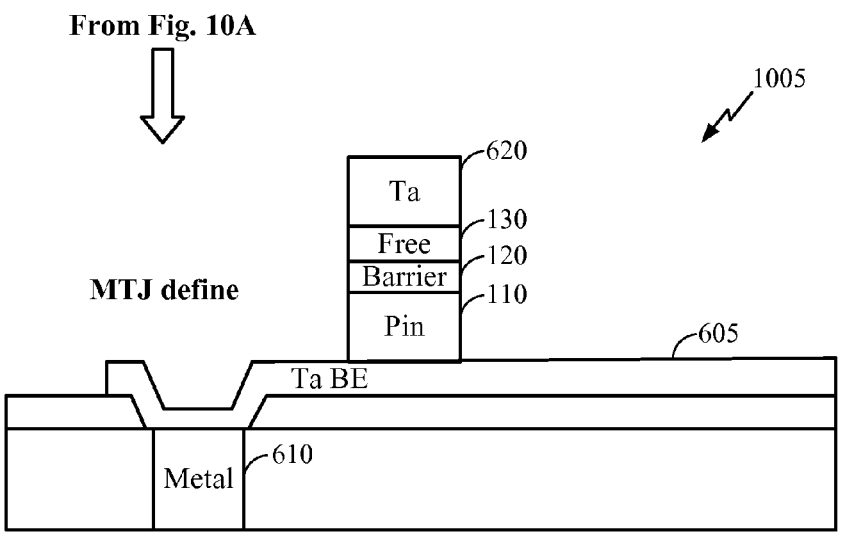

FIG. 10B depicts step 1005, in which material is removed to define the pin layer 110, the barrier layer 120, the free layer 130, and the hard mask 620. Removal can be by etching, milling, or in any manner, conventional or otherwise, as would be known to persons skilled in the relevant art(s).

Figure 10C:
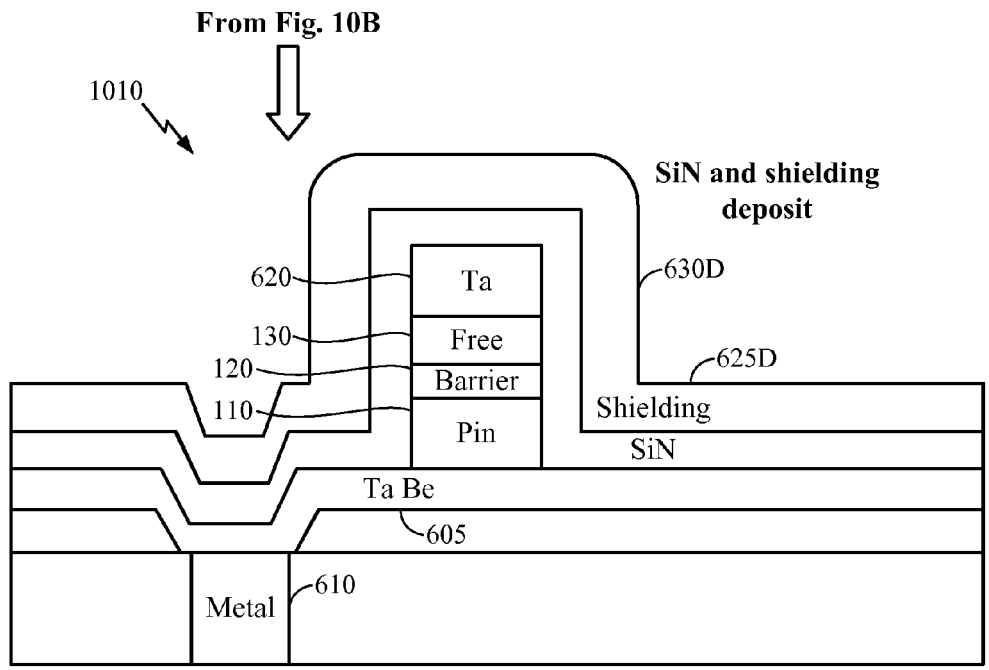

FIG. 10C depicts step 1010, in which the insulating layer 625D is formed on the bottom electrode 605, and the shielding 630D is formed on the insulating layer 625D.

Figure 10D:
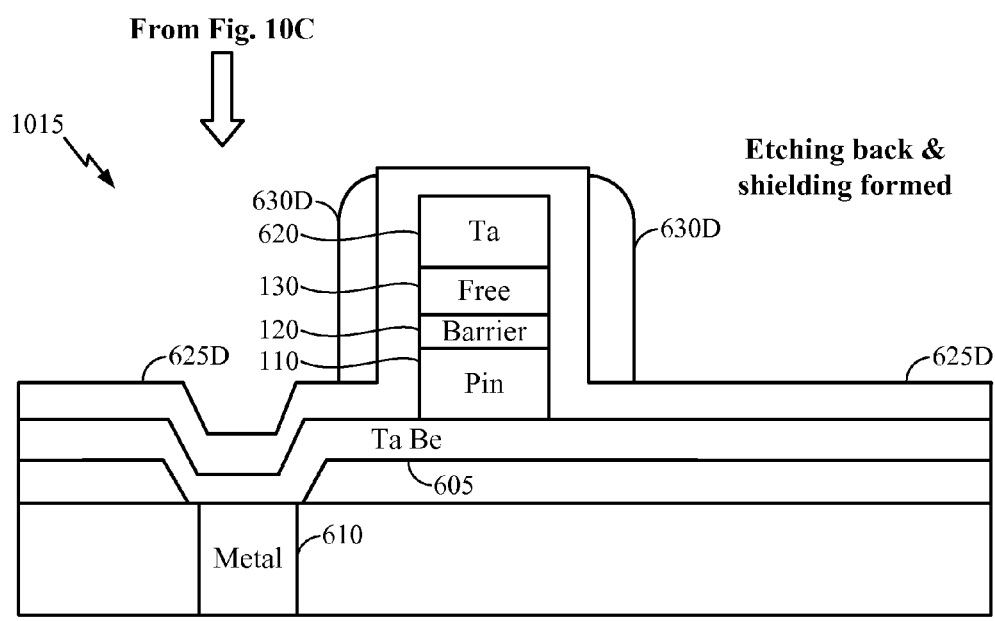

FIG. 10D depicts step 1015, in which the shielding 630D is etched back to form the shielding spacer and to expose the insulating layer 625D.

Figure 10E:
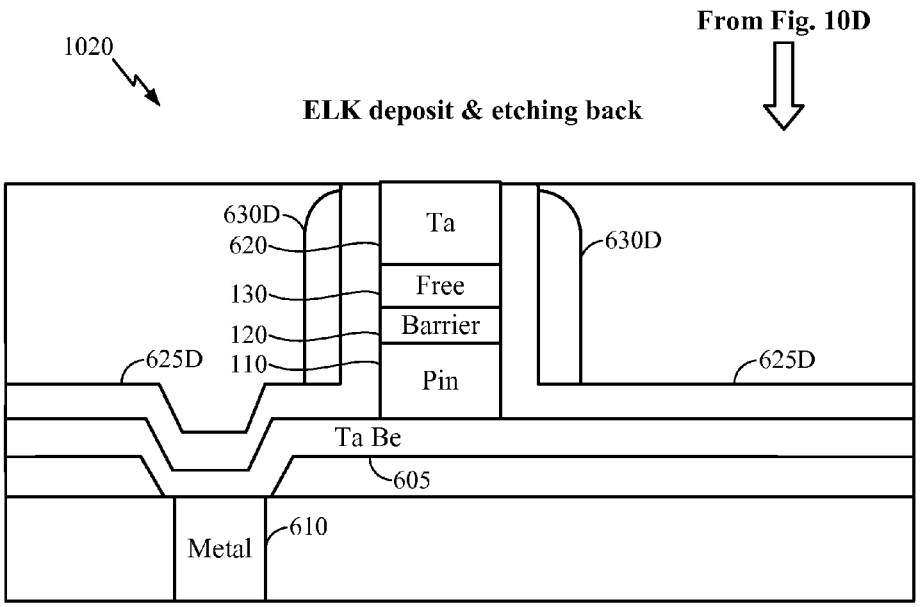

FIG. 10E depicts step 1020, in which a dielectric or extremely low-K film is formed on the insulating layer 625D, and subsequently etched back to expose the hard mask 620.

Figure 10F:
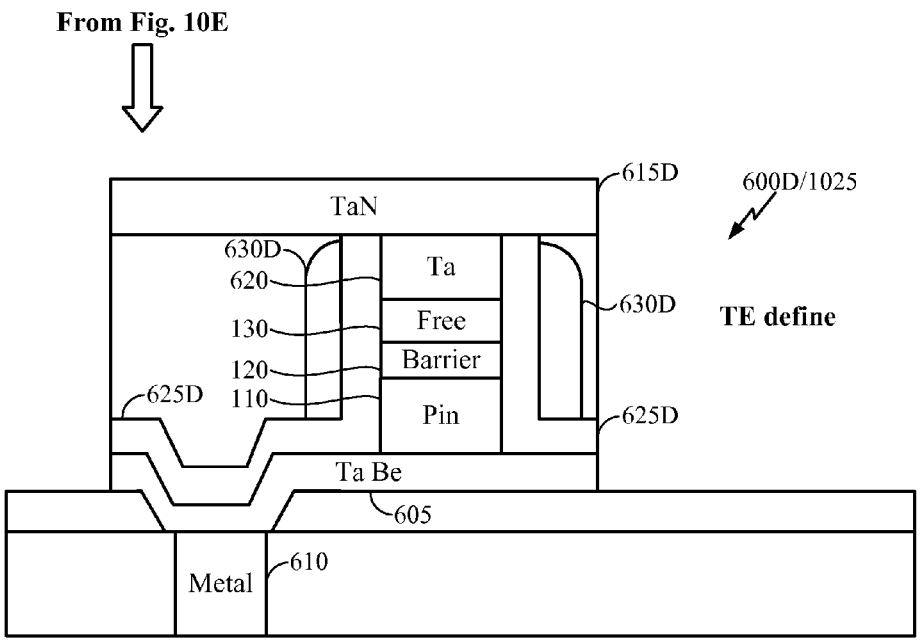

FIG. 10F depicts step 1025, in which the top electrode 615D is formed on the hard mask 620, and the bottom electrode 605 is defined by etching. Steps 1000-1025 form the shielded MTJ structure 600D. At this point, the process proceeds to either step 1030, as shown in FIG. 10G, or step 1035, which is depicted in FIG. 10H.

Figure 10G:
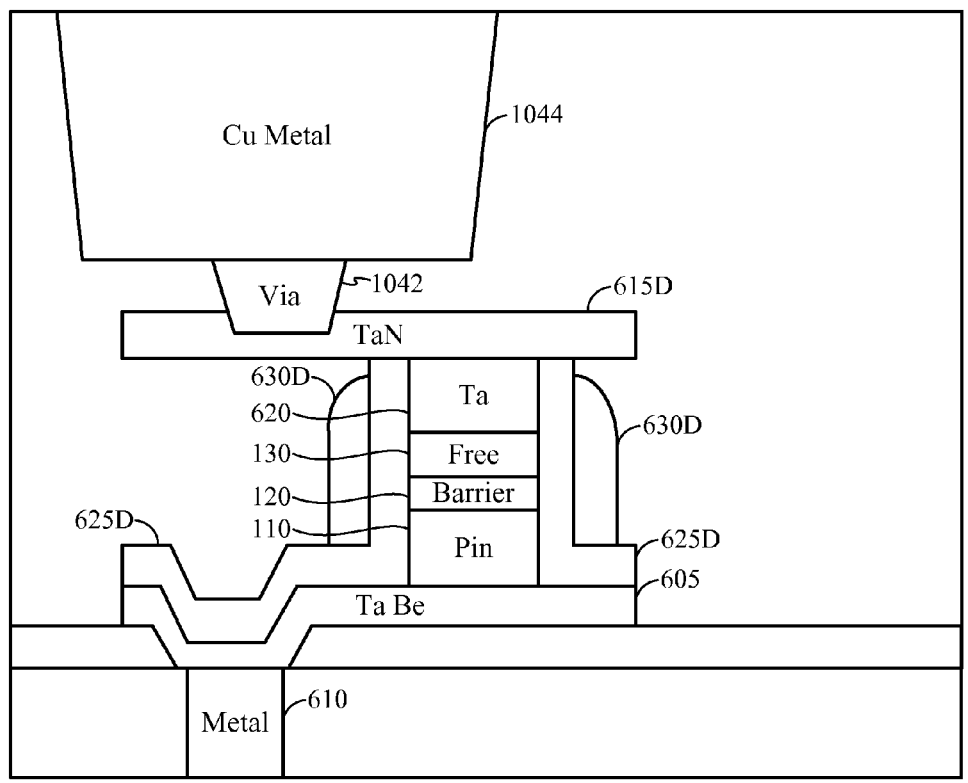

FIG. 10G depicts step 1030, in which a via 1042 and a metal line 1044 are formed on the top electrode 615D. The metal line 1044 can be formed of any suitable electrically conductive material, including copper, aluminum, gold, silver, nickel, tin, titanium, and/or a combination of metals, etc.

Figure 10H:
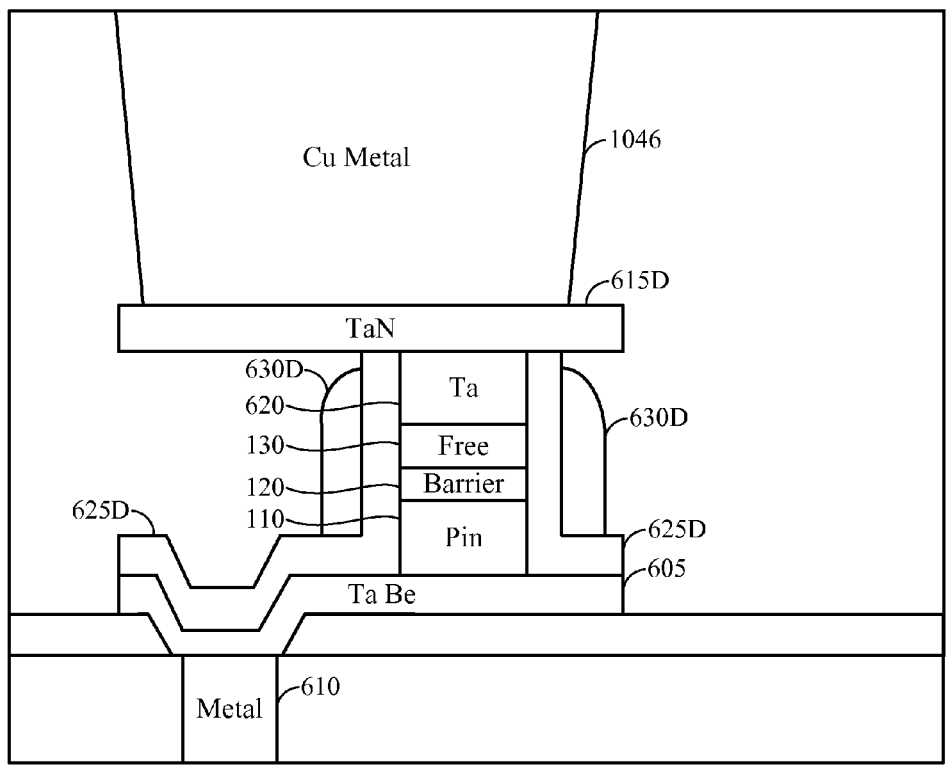

FIG. 10H depicts step 1035, in which a metal line 1046 is formed on the top electrode 615D. The metal line 1046 can be formed of any suitable electrically conductive material, including copper, aluminum, gold, silver, nickel, tin, titanium, and/or a combination of metals, etc.

FIGS. 11A-11I describe steps to form the shielded MTJ structure 600E.

Figure 11A:
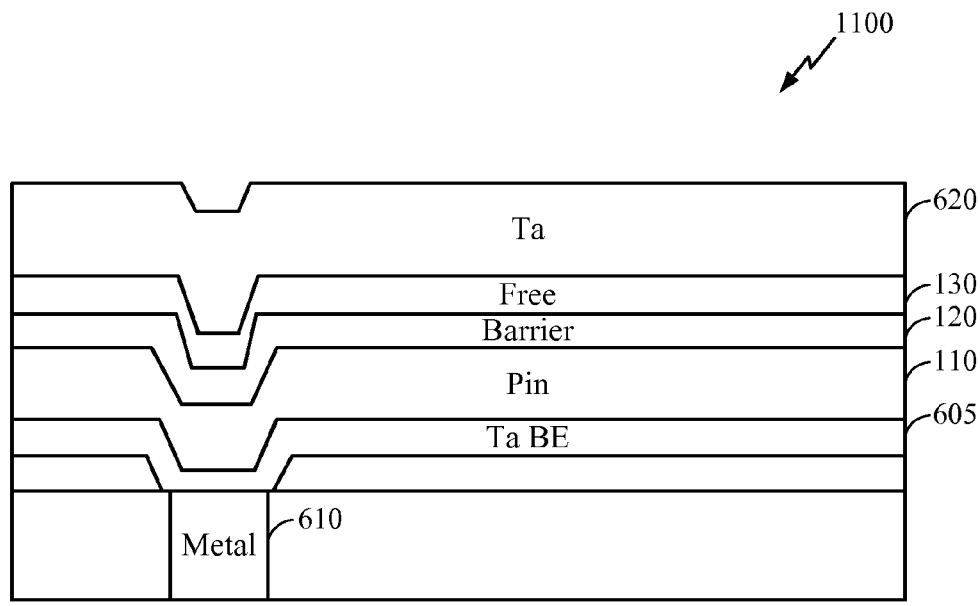
FIGS. 11A-11I describe steps to form another shielded MTJ structure.

FIG. 11A depicts step 1100, in which the metal layer 610 is formed on a substrate. Layers of materials from which the hard mask 620, free layer 130, barrier layer 120, pin layer 110, and bottom electrode 605 are to be formed are deposited on the metal layer 610. The layers can be applied in any manner, conventional or otherwise, as would be known to persons skilled in the relevant art(s). For example, the layers can be formed by sputtering, chemical vapor deposition, plating, lithographic processes, etc.

Figure 11B:
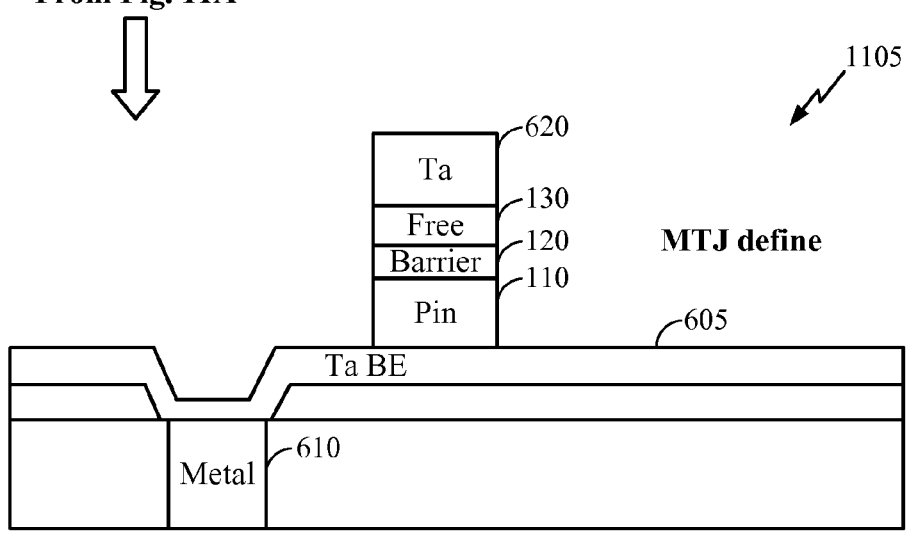

FIG. 11B depicts step 1105, in which material is removed to define the pin layer 110, the barrier layer 120, the free layer 130, and the hard mask 620. Removal can be by etching, milling, or in any manner, conventional or otherwise, as would be known to persons skilled in the relevant art(s).

Figure 11C:
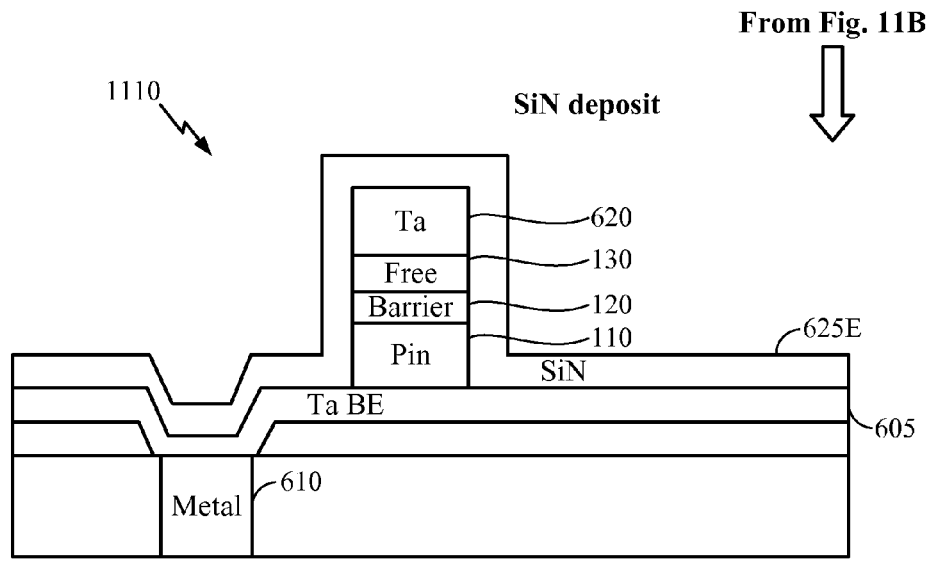

FIG. 11C depicts step 1110, in which the insulating layer 625E is formed on the bottom electrode 605.

Figure 11D:
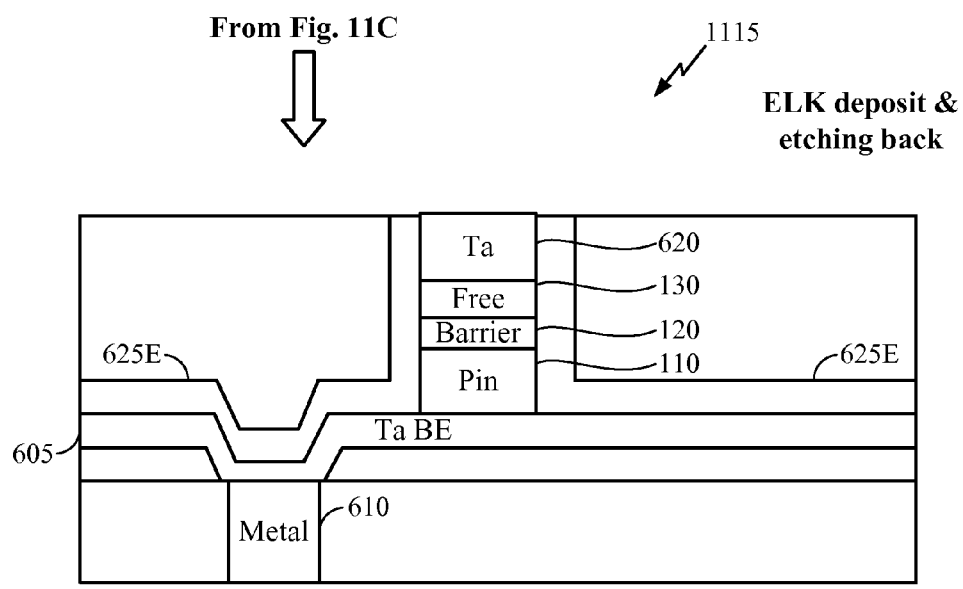

FIG. 11D depicts step 1115, in which a dielectric or extremely low-K film is formed on the insulating layer 625E.

Figure 11E:
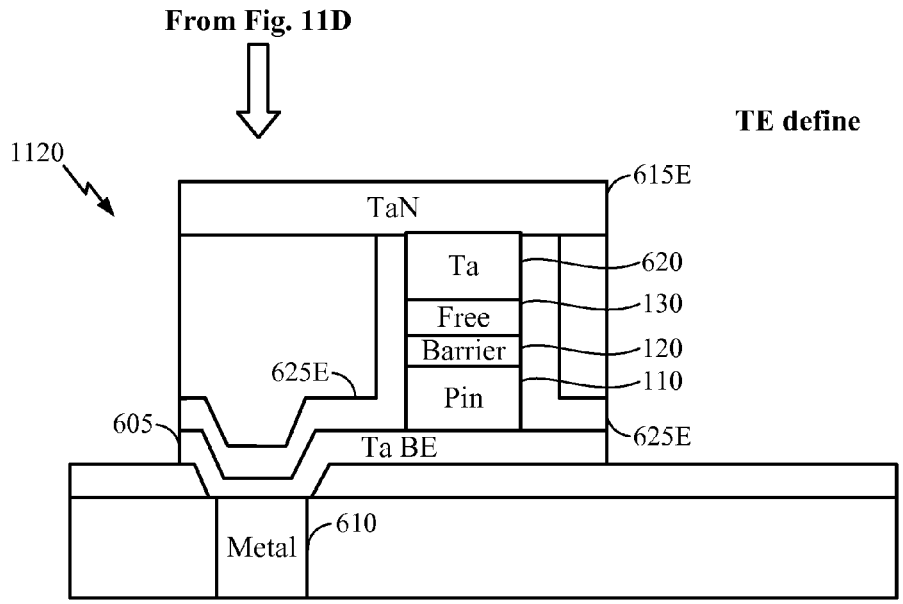

FIG. 11E depicts step 1120, in which the top electrode 615E is formed on the hard mask 620. The bottom electrode 605 is defined by etching.

Figure 11F:
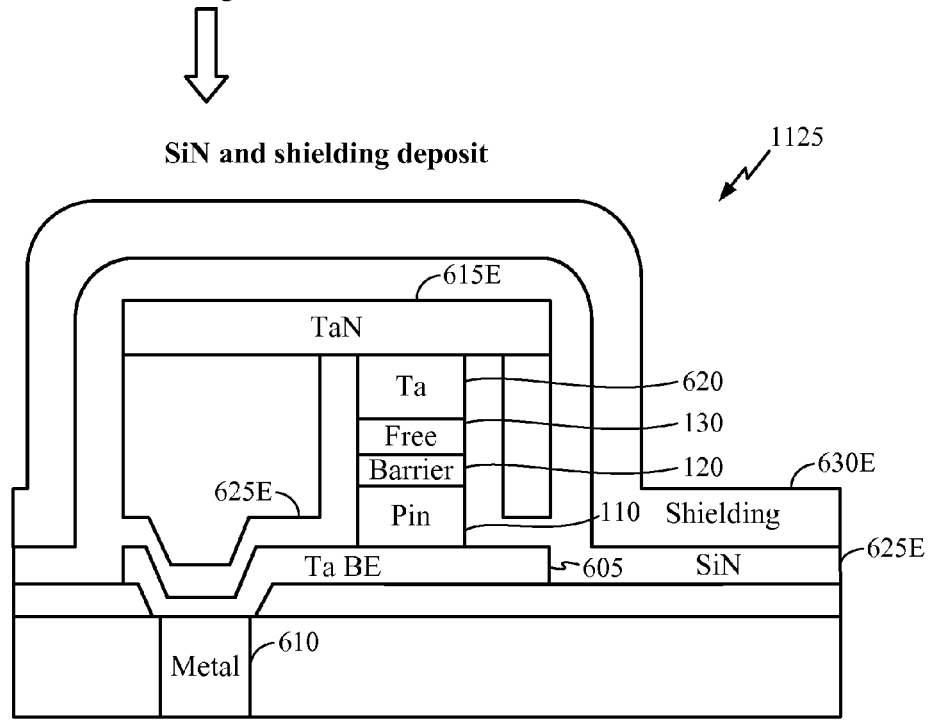

FIG. 11F depicts step 1125, in which another layer of the insulating layer 625E is formed. The shielding 630E is subsequently formed on the insulating layer 625E.

Figure 11G:
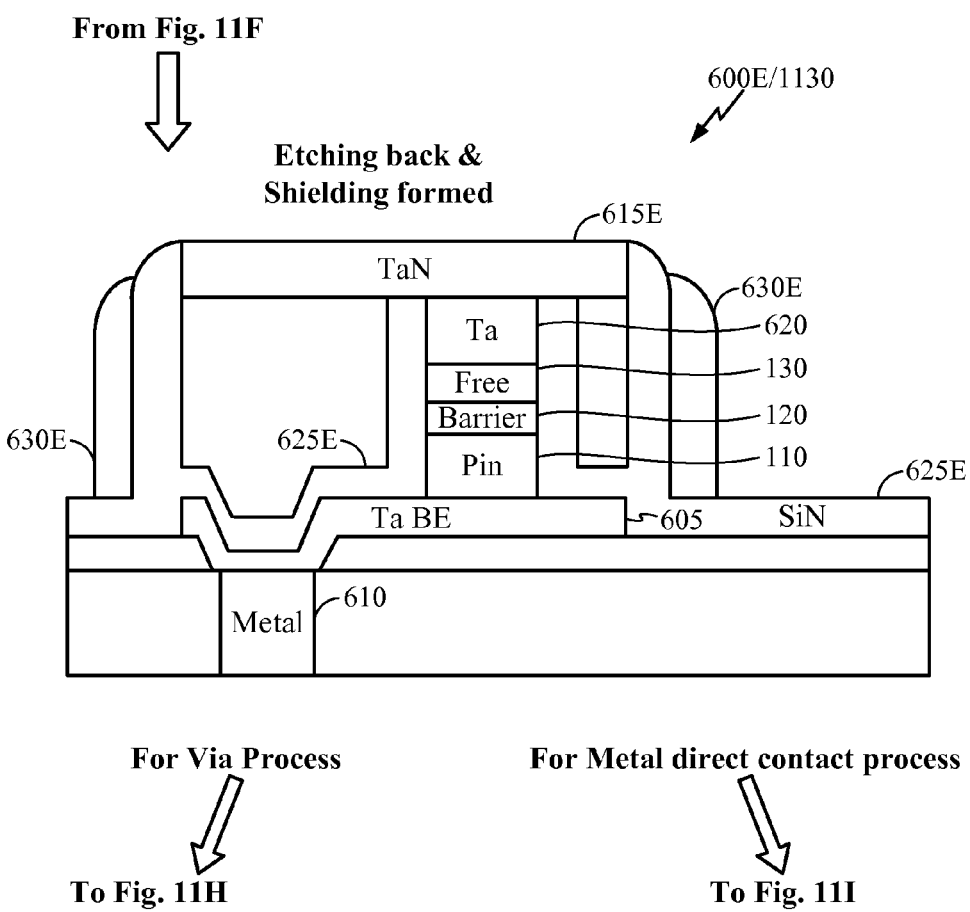

FIG. 11G depicts step 1130, in which the shielding 630E is etched back to expose the top electrode 615E and a portion of the insulating layer 625E. Steps 1100-1130 form the shielded MTJ structure 600E. At this point, the process proceeds to either step 1135, or step 1140.

Figure 11H:
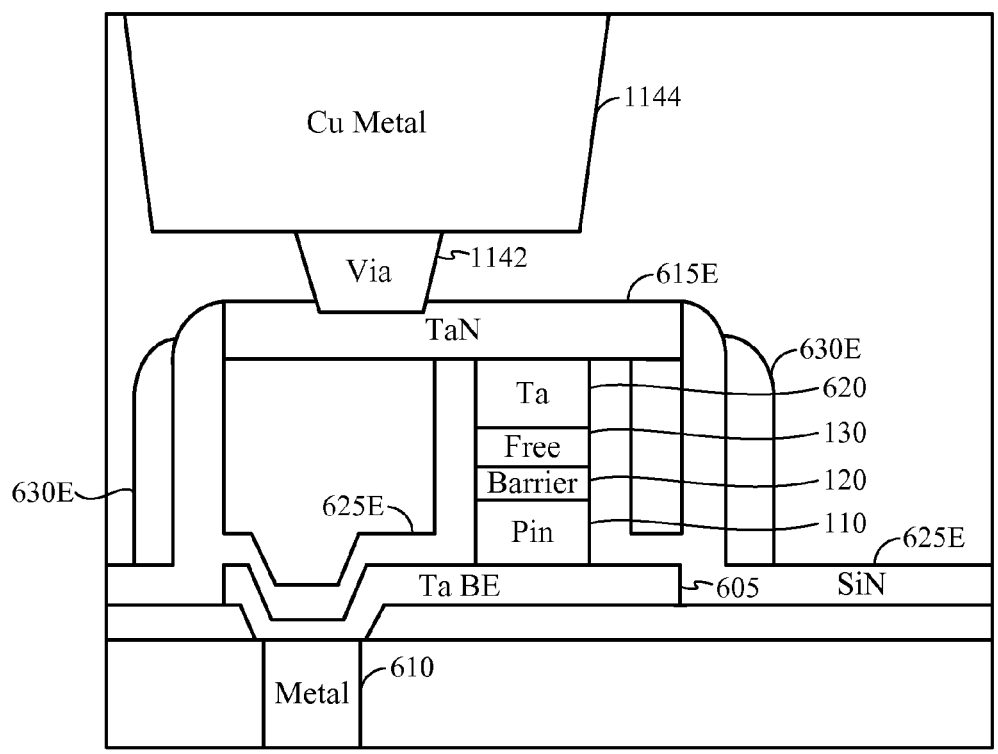

FIG. 11H depicts step 1135, in which a via 1142 and a metal line 1144 are formed on the top electrode 615E. The metal line 1144 can be formed of any suitable electrically conductive material, including copper, aluminum, gold, silver, nickel, tin, titanium, and/or a combination of metals, etc.

Figure 11I:
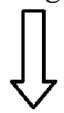
Figure 11I:
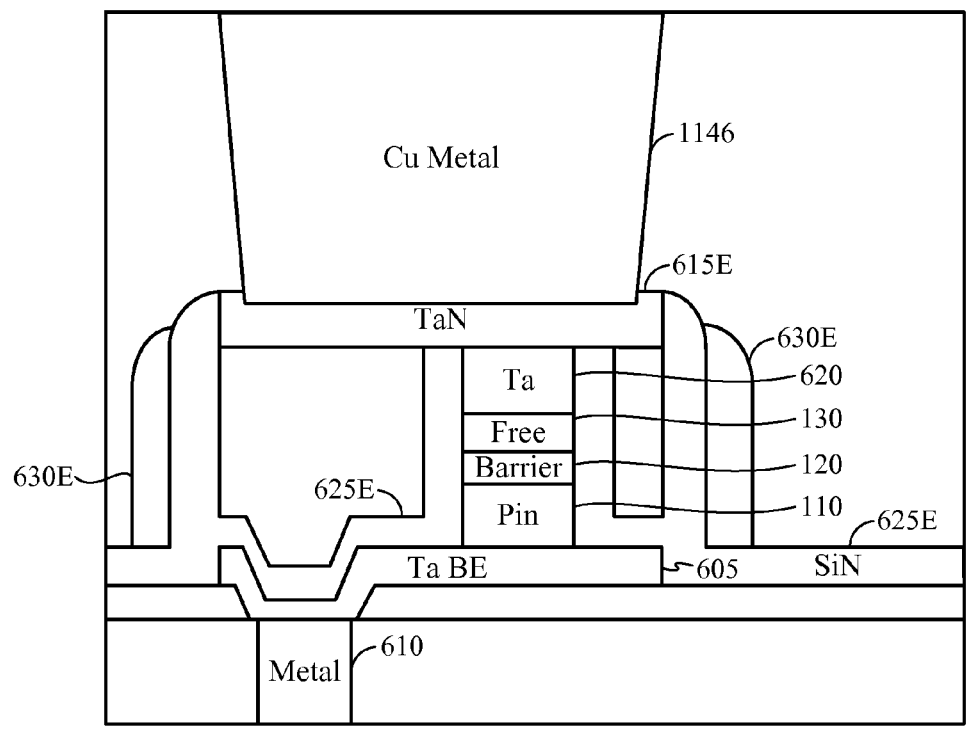

FIG. 11I depicts step 1140, in which a metal line 1146 is formed on the top electrode 615E. The metal line 1146 can be formed of any suitable electrically conductive material, including copper, aluminum, gold, silver, nickel, tin, titanium, and/or a combination of metals, etc.

CONCLUSION

Those of skill in the art will appreciate that information and signals can be represented using any of a variety of different technologies and techniques. For example, data, instructions, commands, information, signals, bits, symbols, and chips that can be referenced throughout the above description can be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present teachings.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1×RTT, 1×EV-DO Re10, RevA, RevB) technology and other technologies. The techniques can be used in emerging and future networks and interfaces, including Long Term Evolution (LTE).

The methods, sequences and/or algorithms described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium can be integral to the processor.

Accordingly, an embodiment of the invention can include a computer readable media embodying a method described herein. Accordingly, the invention is not limited to illustrated examples and any means for performing the functionality described herein are included in embodiments of the invention.

The disclosed devices and methods can be designed and can be configured into GDSII and GERBER computer files, stored on a computer readable media. These files are in turn provided to fabrication handlers who fabricate devices, based on these files, with a lithographic device. The resulting products are semiconductor wafers that are then cut into semiconductor die and packaged into a semiconductor chip. The chips are then employed in devices described herein.

Nothing that has been stated or illustrated is intended to cause a dedication of any component, step, feature, object, benefit, advantage, or equivalent to the public, regardless of whether it is recited in the claims.

While this disclosure shows exemplary embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order.

What is claimed is:

1. A method for protecting a magnetic tunnel junction (MTJ) device by utilizing an integrated shielding apparatus, comprising:
    forming the MTJ device on a substrate, wherein the MTJ device comprises:
        a bottom electrode;
        one or more pinned layers on the bottom electrode;
        a barrier layer on the one or more pinned layers;
        one or more free layers on the barrier layer;
        one or more hardmask layers on the one or more free layers; and
        a top electrode on the one or more hardmask layers;
    forming a shielding layer over the top electrode, such that the shielding layer substantially surrounds a top surface of the top electrode, wherein the shielding layer is formed of a high magnetic permeability material; and
    forming a metal line connection on the shielding layer.

2. The method of claim 1, wherein the metal line connection is through a via coupled to the shielding layer.

3. The method of claim 1, further comprising integrating the MTJ device into an apparatus, selected from the group consisting of a set top box, music player, video player, entertainment unit, navigation device, communications device, personal digital assistant (PDA), fixed location data unit, and a computer.

4. A non-transitory computer-readable medium, comprising instructions stored thereon that, if executed by a lithographic device, cause the lithographic device to perform at least a part of a method, comprising:
    forming a magnetic tunnel junction (MTJ) device on a substrate, wherein the MTJ device comprises:
        a bottom electrode;
        one or more pinned layers on the bottom electrode;
        a barrier layer on the one or more pinned layers;
        one or more free layers on the barrier layer;
        one or more hardmask layers on the one or more free layers; and
        a top electrode on the one or more hardmask layers;
    forming a shielding layer over the top electrode, such that the shielding layer substantially surrounds a top surface of the top electrode, wherein the shielding layer is formed of a high magnetic permeability material; and
    forming a metal line connection on the shielding layer.

5. The computer-readable medium of claim 4, wherein the metal line connection is through a via coupled to the shielding layer.

6. A magnetic tunnel junction (MTJ) device protected by an integrated shielding apparatus, comprising:
    the MTJ device on a substrate, wherein the MTJ device comprises:
        a bottom electrode;
        one or more pinned layers on the bottom electrode;
        a barrier layer on the one or more pinned layers;
        one or more free layers on the barrier layer;
        one or more hardmask layers on the one or more free layers; and
        a top electrode on the one or more hardmask layers;
    a shielding layer over the top electrode, such that the shielding layer substantially surrounds a top surface of the top electrode, wherein the shielding layer is formed of a high magnetic permeability material; and
    a metal line connection on the shielding layer.

7. The MTJ device of claim 6, wherein the metal line connection is through a via coupled to the shielding layer.

8. The MTJ device of claim 6, further comprising a device, selected from the group consisting of a set top box, music player, video player, entertainment unit, navigation device, communications device, personal digital assistant (PDA), fixed location data unit, and a computer, with which the top electrode is integrated.

9. A magnetic tunnel junction (MTJ) device protected by an integrated shielding apparatus, comprising:
    means for reducing a magnetic field intensity in a vicinity of an MTJ electrode using a shielding layer adjacent to the MTJ electrode, such that the shielding layer substantially surrounds a surface of the MTJ electrode, wherein the shielding layer is formed of a high magnetic permeability material; and
    a metal line connection on the shielding layer.

10. The MTJ device of claim 9, wherein the metal line connection is through a via coupled to the shielding layer.

11. The MTJ device of claim 9, further comprising a device, selected from the group consisting of a set top box, music player, video player, entertainment unit, navigation device, communications device, personal digital assistant (PDA), fixed location data unit, and a computer, into which the means for reducing the magnetic field intensity is integrated.

12. A method for protecting a magnetic tunnel junction (MTJ) device by utilizing an integrated shielding apparatus, comprising:
    forming the MTJ device on a substrate, wherein the MTJ device comprises:
        a bottom electrode;
        one or more pinned layers on the bottom electrode;
        a barrier layer on the one or more pinned layers;
        one or more free layers on the barrier layer; and
        one or more hardmask layers on the one or more free layers;
    forming a shielding layer over the one or more hardmask layers, such that the shielding layer completely surrounds a top surface of the one or more hardmask layers, wherein the shielding layer is formed of a high magnetic permeability material;
    forming a top electrode layer over the shielding layer; and
    forming a metal line connection on the top electrode layer.

13. The method of claim 12, wherein the metal line connection is through a via coupled to the second top electrode layer.

14. The method of claim 12, further comprising integrating the MTJ device into an apparatus, selected from the group consisting of a set top box, music player, video player, entertainment unit, navigation device, communications device, personal digital assistant (PDA), fixed location data unit, and a computer.

15. A non-transitory computer-readable medium, comprising instructions stored thereon that, if executed by a lithographic device, cause the lithographic device to perform at least a part of a method, comprising:
    forming an MTJ device on a substrate, wherein the MTJ device comprises:
        a bottom electrode;
        one or more pinned layers on the bottom electrode;
        a barrier layer on the one or more pinned layers;
        one or more free layers on the barrier layer; and
        one or more hardmask layers on the one or more free layers;

forming a shielding layer over the one or more hardmask layers, such that the shielding layer completely surrounds a top surface of the one or more hardmask layers, wherein the shielding layer is formed of a high magnetic permeability material;

forming a top electrode layer over the shielding layer; and forming a metal line connection on the top electrode layer.

16. The computer-readable medium of claim 15, wherein the metal line connection is through a via coupled to the shielding layer.

17. A magnetic tunnel junction (MTJ) device protected by an integrated shielding apparatus, comprising:
the MTJ device on a substrate, wherein the MTJ device comprises:
a bottom electrode;
one or more pinned layers on the bottom electrode;
a barrier layer on the one or more pinned layers;
one or more free layers on the barrier layer; and
one or more hardmask layers on the one or more free layers;
a shielding layer over the one or more hardmask layers, wherein the shielding layer is formed of a high magnetic permeability material, such that the shielding layer completely surrounds a top surface of the one or more hardmask layers;
a top electrode layer over the shielding layer; and
a metal line connection on the top electrode layer.

18. The MTJ device of claim 17, wherein the metal line connection is through a via coupled to the shielding layer.

19. The MTJ device of claim 17, further comprising a device, selected from the group consisting of a set top box, music player, video player, entertainment unit, navigation device, communications device, personal digital assistant (PDA), fixed location data unit, and a computer, with which the top electrode layer is integrated.

20. A method, comprising:
forming a magnetic tunnel junction (MTJ) device on a substrate, wherein the MTJ device comprises:
an MTJ electrode; and
a shielding layer adjacent to the MTJ electrode and substantially surrounding a surface of the MTJ electrode, wherein the shielding layer is formed of a high magnetic permeability material.

21. The method of claim 20, further comprising forming a metal line connection on the shielding layer.

22. The method of claim 20, further comprising forming a via on the shielding layer.

23. The method of claim 20, further comprising integrating the MTJ device into an apparatus selected from the group consisting of a set top box, music player, video player, entertainment unit, navigation device, communications device, personal digital assistant (PDA), fixed location data unit, and a computer.

24. A non-transitory computer-readable medium, comprising instructions stored thereon that, if executed by a lithographic device, cause the lithographic device to perform at least a part of a method, comprising:
forming a magnetic tunnel junction (MTJ) device on a substrate, wherein the MTJ device comprises:
an MTJ electrode; and
a shielding layer adjacent to the MTJ electrode and substantially surrounding a surface of the MTJ electrode, wherein the shielding layer is formed of a high magnetic permeability material.

25. The computer-readable medium of claim 24, wherein the method further comprises forming a metal line connection on the shielding layer.

26. The computer-readable medium of claim 24, wherein the method further comprises forming a via on the shielding layer.

27. An apparatus, comprising:
an magnetic tunnel junction (MTJ) electrode; and
a shielding layer adjacent to the MTJ electrode and substantially surrounding a surface of the MTJ electrode, wherein the shielding layer is formed of a high magnetic permeability material.

28. The apparatus of claim 27, further comprising a metal line connection on the shielding layer.

29. The apparatus of claim 27, further comprising a via on the shielding layer.

30. The apparatus of claim 27, further comprising a device, selected from the group consisting of a set top box, music player, video player, entertainment unit, navigation device, communications device, personal digital assistant (PDA), fixed location data unit, and a computer, with which the MTJ electrode is integrated.

* * * * *